United States Patent [19]

Yamamoto et al.

[11] Patent Number: 5,256,718

[45] Date of Patent: Oct. 26, 1993

[54] FLAME RETARDANT POLYAMIDE THERMOPLASTIC RESIN COMPOSITION

[75] Inventors: Sanehiro Yamamoto; Hideki Sakai; Hirotaka Aso; Kazuo Ishiwatari; Fumitoshi Ikejiri, all of Yamaguchi, Japan

[73] Assignee: Mitsui Petrochemical Industries, Ltd., Tokyo, Japan

[21] Appl. No.: 654,004

[22] Filed: Feb. 12, 1991

[30] Foreign Application Priority Data

| | | | |
|---|---|---|---|
| Feb. 14, 1990 | [JP] | Japan | 1-33447 |
| Feb. 23, 1990 | [JP] | Japan | 1-43535 |
| Aug. 14, 1990 | [JP] | Japan | 1-214586 |
| Nov. 26, 1990 | [JP] | Japan | 1-322198 |

[51] Int. Cl.$^5$ .......... C08K 3/10; C08K 5/02; C08K 5/17; C08K 5/51

[52] U.S. Cl. .......... 524/411; 524/120; 524/127; 524/128; 524/136; 524/148; 524/237; 524/257; 524/258; 524/371; 524/412; 524/417; 524/464; 524/469; 525/69; 525/433

[58] Field of Search .......... 524/464, 411, 417, 128, 524/236, 461, 371, 257, 258, 127, 136, 148, 120, 412, 237, 251; 525/69, 905, 433

[56] References Cited

U.S. PATENT DOCUMENTS

| | | | |
|---|---|---|---|
| 3,216,960 | 11/1965 | Monroe | 524/127 |
| 3,384,615 | 5/1968 | Agouri et al. | 524/258 |
| 3,786,023 | 1/1974 | Dotson et al. | 524/120 |
| 3,989,531 | 11/1976 | Orlando | 525/905 |
| 4,101,505 | 7/1978 | Cooper et al. | 524/141 |
| 4,151,218 | 4/1979 | Lee | 524/411 |
| 4,273,899 | 6/1981 | Saiki et al. | 524/411 |
| 4,355,126 | 10/1982 | Haaf et al. | 524/127 |
| 4,600,741 | 7/1986 | Aycock et al. | 525/68 |
| 4,672,086 | 6/1987 | Seiler et al. | 524/139 |
| 4,710,317 | 12/1987 | Tabata et al. | 524/120 |
| 4,788,244 | 11/1988 | Nakahashi et al. | 524/411 |
| 4,791,145 | 12/1988 | Pressman | 521/139 |
| 4,831,072 | 5/1989 | Favstrisky et al. | 524/412 |
| 4,965,301 | 10/1990 | Leininger | 524/417 |
| 5,034,439 | 7/1991 | Breitenfellner et al. | 524/411 |
| 5,112,898 | 5/1992 | Dever et al. | 524/468 |

*Primary Examiner*—Paul R. Michl
*Assistant Examiner*—Tae H. Yoon
*Attorney, Agent, or Firm*—Sherman and Shalloway

[57] ABSTRACT

The present invention provides resin compositions containing thermoplastic resins. Thermoplastic resins employable for the compositions are polyolefin resins, polyester resins, polystyrene resins, polyamide resins and polyphenylene ether resins. The present invention can be particularly effected by using polyamide, particularly, specific aromatic polyamides.

In the present invention, the resin compositions can be improved in various chemical and physical properties such as flame-retardance, moldability, color tone, heat stability, mechanical strength by the use of other resin component and stabilizers such as halogenated organic compounds, modified polyolefins, antimony compounds, phosphorus-containing compounds, amine- or phosphorus-type stabilizers.

28 Claims, No Drawings

FLAME RETARDANT POLYAMIDE THERMOPLASTIC RESIN COMPOSITION

FIELD OF THE INVENTION

The present invention relates to thermoplastic resin compositions. More particularly, the invention relates to thermoplastic resin compositions which are remarkably improved in various chemical and physical properties such as flame-retardance, granulation properties, molding properties, color tone, heat resistance, heat aging characteristics, heat stability, abrasion resistance and strength.

BACKGROUND OF THE INVENTION

In recent days, resin materials have been widely employed in various fields, and for the purpose of satisfying physical and chemical properties required for the resin materials, there have been developed various resin compositions by incorporating additives, fillers, reinforcing agents, etc. to various resins.

For example, in accordance with the integration of electronic components, physical and chemical properties (specifically, heat resistance and flame retardance) of extremely high level have been required for the resin materials used in this electronic art. The resin materials are utilized as prinitable circuit boards, semiconductor packages, etc. of electric or electronic parts. As is well known, the electric or electronic components work upon application of an electric current, and in this stage a heat is generated. As the electronic machines have been used in more various surroundings or the electric circuits have been made more integrated recently, the printable circuit boards or the semiconductor packages are used continuously and at extremely high temperatures, and hence heat resistance and flame retardance of much higher level are eagerly required for the resin materials used therefor.

As an organic material having high heat resistance and high flame retardance, a flame-retardant resin composition obtained by adding a halogenated organic compound and an antimony-containing compound to a thermoplastic resin is employed.

Among thermoplastic resins, polyamides are known as engineering plastics being excellent in mechanical and chemical properties, and a representative example of polyamides is nylon. In the practical use, various additives can be added to the polyamides depending on the purpose. Most of the polyamide resins have a melting point higher than that of other resins such as polyphenyl sulfide. Further, these polyamide resins have a high crystallinity, and they are excellent in other properties such as heat distortion resistance of the resin without reinforcement, sliding properties and fatigue resistance.

Among the polyamide resins, aliphatic polyamides represented by nylon 6 and nylon 66 are utilized in the art of synthetic fibers. It is known that a copper-containing compound is added to the aliphatic polyamides to obtain compositions which are hardly oxidized even when exposed to high temperatures for a long period of time to be inhibited from the lowering of the mechanical properties.

Further, it has been recently known that the aromatic polyamides are excellent in various properties such as abrasion resistance, strength, chemical resistance, heat resistance and molding properties. Therefore, the aromatic polyamides are utilized as engineering plastics employable as resin materials for automobile industry and for electrical industry.

However, those conventional resin compositions still have various problems.

For example, the above-mentioned flame-retardant resin composition comprising a thermoplastic resin, a halogenated organic compound and an antimony-containing compound often brings about strand-foaming in the granulation stage or coloring of pellets.

Further, when the flame-retardant polyamide resin, that is one of the thermoplastic resins, is subjected to continuous injection molding for a long period of time, a mold of the molding machine might be little by little deposited with a decomposition product of the resin (this deposition is referred to hereinafter as "mold-staining"). If the mold-staining occurs, the transfer efficiency of the mold tends to lower or the decomposition product of the resin is easily introduced into the resulting molded product. Moreover, a gas bent is choked up with the decomposition product of the resin to cause burn marks of the resin.

For these reasons, the mold is generally cleaned at regular intervals to remove stains from the mold. For cleaning the mold, the molding operation is compelled to be stopped, and as a result, the production of the molded products is stopped.

From the viewpoint of productivity, therefore, eagerly desired are flame-retardant polyamide resins which hardly bring about mold-staining.

In the art of electronic parts, there has been recently employed a method comprising fitting electronic components having a part formed from the polyamide resin (such as housing thereof) onto a printable wiring board and then firmly fixing the electronic components to the board utilizing infrared rays reflow-soldering. However, the conventional polyamide resin compositions are unsuitable for this method, because they are insufficient in the heat resistance and the flame retardance.

The infrared rays reflow-soldering is a method for fixing electronic components onto the circuit board. The method comprises temporarily fixing the electronic components onto the predetermined portions of a circuit board which has been beforehand provided with solder dots on the portions, and melting the solder under irradiation of the board with infrared rays to firmly fix the electronic components onto the circuit.

In the conventional method for fixing the electronic components onto the circuit board using a solder bath, it is difficult to fit the electronic components on the board with a high denseness, so that the above-mentioned infrared rays reflow-soldering has been employed instead of the conventional method, to improve the denseness.

However, a problem still resides in the infrared rays reflow-soldering. That is, infrared rays are applied from the upper side of the board in this method, and the electronic part-forming materials using conventional polyamide resin compositions have a low melting point as well as ABS resin, polycarbonate and polybutylene terephthalate, so that the temperature for the infrared rays reflow-soldering cannot be sufficiently raised.

Japanese Patent Provisional Publication No. 36(1961)-317552 discloses nylon 46 containing a brominated crosslinking aromatic polymer as the flame-retardant resin composition formed by using brominated compounds of polyvinyl aromatic compounds (e.g., divinylbenzene and divinylxylene) or brominated compounds of crosslinking aromatic polymers synthesized by forming a crosslinking structure in linear polyvinyl compounds such as polystyrene, polyvinyltoluene, polymethylstyrene and polyvinyltoluene in addition to monovinyl aromatic compounds (e.g., styrene, methylstyrene and vinyltoluene) are employed in the publication.

The above publication describes that the flame-retardants are effectively employed for nylon 46, but does not describe any relationship between the flame-retardants and other polyamides.

The present inventors have found that the aromatic polyamides are excellent in mechanical properties and in heat resistance of a short term, but they markedly deteriorate in the mechanical properties because of oxidation thereof when exposed to high temperatures for a long period of time. For improving the mechanical properties of the aromatic polyamides, a method of adding copper-containing compounds to the aromatic polyamides can be thought as in the aforementioned aliphatic polyamides. However, if the copper-containing compounds are added to the aromatic polyamides, any satisfactory effects cannot be obtained.

The present inventors have earnestly studied to solve the above-described problems existing in the prior arts, and as a result, they obtained the following findings and accomplished the invention.

That is, the resin compositions comprising a thermoplastic resin, a halogenated organic compound and an antimony-containing compound can be remarkably improved in granulation properties and color shades of pellets, by adding a phosphorus-containing compound thereto. In addition, other properties of the compositions such as heat resistance and flame retardance are never marred even by adding the phosphorus-containing compound.

Moreover, thus obtained resin compositions (i.e., flame-retardant resins) can reduce occurrence of the aforementioned mold-staining by adding thereto at least one of an amine-type stabilizer and a phosphorus-type stabilizer.

In the case of using polyamide as the thermoplastic resin, if a brominated compound of a polymer formed from an aromatic vinyl compound and a specific carboxylic acid is introduced into a resin composition, the resulting resin composition can be provided with an extremely high flame retardance.

Further, if an aromatic amine-type stabilizer and an organic phosphite-type stabilizer are added to a specific aromatic polyamide, there can be obtained a resin composition having high heat aging characteristics and showing high heat stability in the molding stage.

OBJECTS OF THE INVENTION

It is the first object of the invention to provide a thermoplastic resin composition which is remarkably improved in granulation properties and color shades of pellets and is not lowered in heat resistance or flame retardance.

It is the second object of the invention to provide a thermoplastic resin composition capable of reducing occurrence of mold-staining in the molding stage.

It is the third object of the invention to provide a resin composition which is excellent in heat resistance and heat stability as well as in the flame retardance and is suitably employable for electronic components which are fixed to a circuit board through infrared rays reflow-soldering.

It is the fourth object of the invention to provide a polyamide resin composition which is very excellent not only in the heat aging characteristics and molding stability but also in the mechanical, chemical and physical properties.

SUMMARY OF THE INVENTION

The first thermoplastic resin composition of the invention is a flame-retardant resin composition comprising a thermoplastic resin, a halogenated organic compound, an antimony-containing compound and a phosphorus-containing compound.

The second thermoplastic resin composition of the invention is a flame-retardant resin composition comprising polyamide, a halogenated organic compound, an antimony-containing compound, a phosphorus-containing compound, and an amine-type stabilizer and/or a phosphorus-type stabilizer.

The third thermoplastic resin composition of the invention is a flame-retardant resin composition comprising polyamide, and a brominated compound of a copolymer formed from an aromatic vinyl monomer and an $\alpha,\beta$-unsaturated (di)carboxylic acid.

The fourth thermoplastic resin composition of the invention is an aromatic polyamide resin composition comprising:

[I] aromatic polyamide composed of a carboxylic acid constituent unit (a) and a diamine constituent unit (b), the carboxylic acid constituent unit (a) being composed of a terephthalic acid constituent unit in an amount of 20 to 100% by mole, and at least one of an aromatic dicarboxylic acid constituent unit other than the terephthalic acid constituent unit in an amount of 0 to 80% by mole and an aliphatic dicarboxylic acid constituent unit having 4–20 carbon atoms in an amount of 0 to 80% by mole, the diamine constituent unit (b) being composed of at least one of an aliphatic diamine constituent unit and an alicyclic diamine constituent unit;

[III] an aromatic amine-type stabilizer; and

[IV] an organic phosphite-type stabilizer.

The fifth thermoplastic resin composition of the invention is an aromatic resin composition comprising:

[I] aromatic polyamide composed of a dicarboxylic acid constituent unit (a) and a diamine constituent unit (b), said dicarboxylic acid constituent unit (a) being composed of a terephthalic acid constituent unit in an amount of 20 to 100% by mole and, at least one of an aromatic dicarboxylic acid constituent unit other than a terephthalic acid constituent unit in an amount of 0 to 80% by mole and an aliphatic dicarboxylic acid constituent unit having 4–20 carbon atoms in an amount of 0 to 80% by mole, said diamine constituent unit (b) being composed of at least one of an aliphatic diamine constituent unit and an alicyclic diamine constituent unit;

[II] modified polyolefin;

[III] an aromatic amine-type stabilizer; and

[IV] an organic phosphite-type stabilizer.

DETAILED DESCRIPTION OF THE INVENTION

In the resin compositions of the invention, a thermoplastic resin is employed as a host resin component. The thermoplastic resin will be described in detail hereinafter.

Examples of the thermoplastic resins employable in the first thermoplastic resin composition of the invention include polyolefin resins, polyester resins, polystyrene resins, polyamide resins and polyphenylene ether resins. These thermoplastic resins can be employed singly or in combination.

The above-mentioned polyolefin resin is a polymer containing as its one component α-olefin represented by the following formula (A):

$$CH_2=CHR \quad (A)$$

wherein R is hydrogen or an alkyl group having 1 to 20 carbon atoms.

Concrete examples of the polyolefin resins include polyethylene, an ethylene/butene-1 copolymer, an ethylene/3-methylbutene-1 copolymer, an ethylene/4-methylpentene-1 copolymer, an ethylene/hexene-1 copolymer, an ethylene/vinyl acetate copolymer, an ethylene/acrylic acid copolymer, metal salts of an ethylene/acrylic acid copolymer, polypropylene, a propylene/ethylene copolymer, a propylene/butene-1 copolymer, polybutene-1, a butene-1/ethylene copolymer, a butene-1/4-methylpentene-1 copolymer, poly4-methylpentene-1, poly4-methylpentene-1 and poly3-methylbutene-1. Of these, preferred are polyethylene, polypropylene, polybutene-1 and poly4-methylpentene-1. These polyolefin resins can be employed singly or in combination of two or more compounds.

The above-mentioned polyester resin is a polymer having a constituent unit represented by the following formula (B):

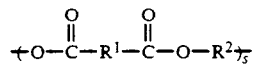
(B)

wherein each of $R^1$ and $R^2$ is an aliphatic, alicyclic or aromatic hydrocarbon or its derivative, and s is a positive integer.

Examples of the polyester resins include polyesters of dicarboxylic acids (e.g., isophthalic acid, terephthalic acid, naphthalenedicarboxylic acid, 4,4'-diphenoxyethanedicarboxylic acid, adipic acid, sebacic acid and cyclohexanedicarboxylic acid) with diols (e.g., ethylene glycol, trimethylene glycol, tetramethylene glycol, hexamethylene glycol, cyclohexanedimethanol, bisphenol A, hydroquinone and resorcine). Particularly preferred are polyethylene terephthalate and polybutylene terephthalate. These polyester resins can be employed singly or in combination of two or more compounds.

The above-mentioned polystyrene resin is a polymer having a constituent unit represented by the following formula (C):

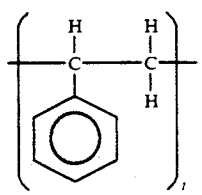
(C)

wherein t is a positive integer.

As the polystyrene resin, there can be employed not only polymers of styrene monomers (i.e., polystyrene) but also copolymers of styrene monomers and other monomers such as acrylonitrile, acrylic esters, ethylene and phthalic anhydride. Examples of such copolymers include a styrene/acrylonitrile copolymer, a styrene/acrylonitrile/butadiene copolymer, a styrene/ethylene/acrylonitrile copolymer and a styrene/maleic anhydride copolymer. These polystyrene resins can be employed singly or in combination of two or more compounds.

The above-mentioned poly(phenylene ether) resin has the following formula (D):

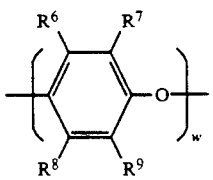
(D)

wherein each of $R^6$, $R^7$, $R^8$ and $R^9$ is independently a hydrogen atom, a halogen atom, an alkyl group, an alkoxy group, a cyano group, a nitro group, an amino group, a phenoxy group or a sulfone group, and w is a positive integer.

Examples of the poly(phenylene ether) resins having the formula (D) include poly-1,4-phenylene ether, poly-2,6-dimethyl-1,4-phenylene ether, poly-2,6-diethyl-1,4-phenylene ether, poly-2,6-dipropyl-1,4-phenylene ether, poly-2-methyl-6-isopropyl-1,4-phenylene ether, poly-2,6-dimethoxy-1,4-phenylene ether, poly-2,6-dichloromethyl-1,4-phenylene ether, poly-2,6-diphenyl-1,4-phenylene ether, poly-2,6-dinitrile-1,4-phenylene ether, poly-2,6-dichloro-1,4-phenylene ether and poly-2,5-dimethyl-1,4-phenylene ether. These poly(phenylene ether) resins can be employed singly or in combination of two or more compounds.

As the polyamide resin employable for the first thermoplastic resin composition of the invention, there can be mentioned polyamide resins employable for the second to fifth thermoplastic resin compositions of the invention.

The polyamide resins employable for the second and third thermoplastic resin compositions of the invention are linear polymers having an amide bond, and examples of such polymers include a polymer obtained by polycondensation of an organic diamine and an organic dicarboxylic acid, a polymer obtained by polycondensation of an aminocaproic acid, and a polymer obtained by ring-opening of lactams. Concrete examples thereof are polymers having a constituent unit represented by the following formula (E) or (F).

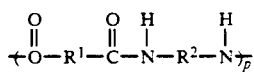
(E)

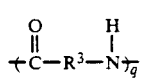
(F)

In the formula (E) or (F), each of p and q is a positive integer, and each of $R^1$, $R^2$ and $R^3$ is an aliphatic, alicyclic or aromatic hydrocarbon or its derivative.

As the polyamide, there can be more concretely mentioned aliphatic polyamides such as ring-opened polymers of lactams, namely cyclic amides, (e.g., polycapronamide produced by ε-caprolactam: nylon 6), polycondensates of aminocarboxylic acids (e.g., polyundecanamide produced by ω-aminoundecanoic acid:

nylon 11; polydodecanamide produced by ω-aminododecanoic acid: nylon 12), polycondensates of aliphatic dicarboxylic acids and aliphatic diamines (e.g., polyhexamethylene adipamide produced by adipic acid and hexamethylenediamine: nylon 6,6; polyhexamethylene sebacamide produced by sebacic acid and hexamethylenediamine: nylon 6,10; polyhexamethylene dodecamide produced by dodecane diacid and hexamethylenediamine: nylon 6,12; polyundecamethylene adipamide produced by adipic acid and undecamethylenediamine: nylon 11,6; polytetramethylene adipamide produced by adipic acid and tetremethylenediamine: nylon 4,6); aromatic polyamides, namely, polycondensates of aromatic dicarboxylic acids and aliphatic diamines; and all aromatic polyamides such as polycondensates of aromatic dicarboxylic acids and aromatic diamines (e.g., polyhexamethylene terephthalamide: nylon 6T; polyhexamethylene isophthalamide: nylon 6I; and polymethaxylylene adipamide: MXD6).

Also employable are copolycondensation polyamides (e.g., nylon 6/nylon 66, nylon 6/nylon 610, nylon 6/nylon 12, nylon 6/nylon 66/nylon 610, nylon 66/nylon 46, nylon 6/nylon 46, nylon 6/nylon 6T, nylon 6/nylon 6I, nylon 6T6, nylon 6TI, nylon 6T10 and nylon 6T12); polyester amides; and polyether amides.

In the invention, the above-mentioned polyamide resins can be employed singly or in combination of two or more kinds.

The second and third thermoplastic resin compositions of the invention contain the above polyamide as a host resin component.

Further, in the second and third thermoplastic resin compositions of the invention, preferably employed is an aromatic polyamide [I] composed of a specific dicarboxylic acid constituent unit [X] and a specific alkylenediamine constituent unit [Y].

Also in the fourth and fifth thermoplastic resin compositions of the invention, the above-mentioned aromatic polyamide [I] is employed as a host resin component.

The aromatic polyamide [I] is described below in detail.

The specific dicarboxylic acid constituent unit [X]contained in the aromatic polyamide [I] contains a terephthalic acid constituent unit (a) as an essential constituent unit. The polyamide recurring unit containing the terephthalic acid constituent unit (a) is represented by the following formula [I-a]:

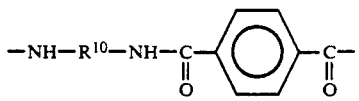

wherein $R^{10}$ is an alkylene group having 4–25 carbon atoms.

The specific dicarboxylic acid constituent unit constituting the aromatic polyamide may contain a dicarboxylic acid constituent unit other than the above-mentioned terephthalic acid constituent unit (a).

As the dicarboxylic acid constituent unit other than the terephthalic acid constituent unit, there can be mentioned an aromatic dicarboxylic acid constituent unit (b) other than the terephthalic acid and an aliphatic dicarboxylic acid constituent unit (c).

Examples of the aromatic dicarboxylic acid constituent unit (b) other than the terephthalic acid include constituent units derived from an isophthalic acid (IA), a phthalic acid, a 2-methylterephthalic acid, a naphthalenedicarboxylic acid and a diphenyldicarboxylic acid. If the polyamide used for the second to fifth resin compositions according to the invention contains the aromatic dicarboxylic acid constituent unit (b) other than the terephthalic acid, preferred examples of the constituent unit (b) are an isophthalic acid constituent unit and a naphthalenedicarboxylic acid constituent unit, and particularly preferred is an isophthalic acid constituent unit.

A recurring unit having a most preferred isophthalic acid constituent unit among the aromatic dicarboxylic acid constituent units (b) other than the terephthalic acid is represented by the following formula [I-b]:

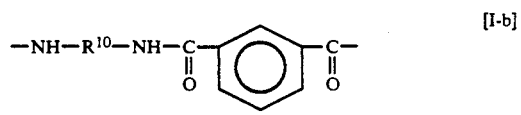

wherein $R^{10}$ is an alkylene group having 4–25 carbon atoms.

There is no specific limitation on the aliphatic acid constituent unit (c), but preferably the constituent unit (c) is derived from an aliphatic dicarboxylic acid constituent unit having 4–20 (preferably 6–12) carbon atoms. Examples of aliphatic dicarboxylic acids used for deriving the aliphatic dicarboxylic acid constituent unit (c) include a succinic acid, an adipic acid (AA), an azelaic acid, a sebacic acid, a decanedicarboxylic acid, a undecanedicarboxylic acid and a dodecanedicarboxylic acid. If the aromatic polyamide according to the invention contains the aliphatic dicarboxylic acid constituent unit (c), preferred examples of the constituent unit (c) are an adipic acid constituent unit and a sebacic acid constituent unit.

A recurring unit containing the aliphatic dicarboxylic acid constituent unit (c) is represented by the following formula [I-c]:

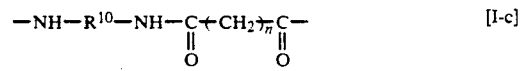

wherein n is an integer of 2 to 20, preferably 2 to 18, more preferably 4 to 12, particularly 4 to 10, and $R^{10}$ is alkylene group having 4–25 carbon atoms.

As the dicarboxylic acid constituent unit [X], a polycarboxylic acid constituent unit can be contained in the polyamide in a small amount (e.g., approx. not more than 10% by mole), in addition to the above-described terephthalic acid constituent unit (a) and the above-described dicarboxylic acid constituent unit (b), (c) other than the terephthalic acid constituent unit. Concrete examples of the polycarboxylic acid constituent units are constituent units derived from tribasic acids (e.g., a trimellitic acid) and polybasic acids (e.g., a pyromellitic acid).

There is no specific limitation on the diamine constituent unit [Y] constituting the aromatic polyamide together with the above-mentioned dicarboxylic acid constituent unit [X], but in general, it is derived from aliphatic alkylenediamine and/or alicyclic alkylenediamine, particularly, aliphatic alkylenediamine having 4–25 (preferably 6–25, more preferably 4–18) carbon atoms and/or alicyclic alkylenediamine having the same carbon atoms.

The aliphatic diamine constituent unit may be an alkylenediamine constituent unit of straight chain or that of branched form.

Examples of the aliphatic diamine constituent unit are as follows.

Constituent units derived from the following alkylenediamines of straight chain:
1,4-diaminobutane
1,6-diaminohexane
1,7-diaminoheptane
1,8-diaminooctane
1,9-diaminononane
1,10-diaminodecane
1,11-diaminoundecane
1,12-diaminododecane Constituent units derived from the following alkylenediamines of branched form:
1,4-diamino-1,1-dimethylbutane
1,4-diamino-1-ethylbutane
1,4-diamino-1,2-dimethylbutane
1,4-diamino-1,3-dimethylbutane
1,4-diamino-1,4-dimethylbutane
1,4-diamino-2,3-dimethylbutane
1,2-diamino-1-butylethane
1,6-diamino-2,5-dimethylhexane
1,6-diamino-2,4-dimethylhexane
1,6-diamino-3,3-dimethylhexane
1,6-diamino-2,2-dimethylhexane
1,6-diamino-2,2,4-trimethylhexane
1,6-diamino-2,4,4-trimethylhexane
1,7-diamino-2,3-dimethylheptane
1,7-diamino-2,4-dimethylheptane
1,7-diamino-2,5-dimethylheptane
1,7-diamino-2,2-dimethylheptane
1,8-diamino-1,3-dimethyloctane
1,8-diamino-1,4-dimethyloctane
1,8-diamino-2,4-dimethyloctane
1,8-diamino-3,4-dimethyloctane
1,8-diamino-4,5-dimethyloctane
1,8-diamino-2,2-dimethyloctane
1,8-diamino-3,3-dimethyloctane
1,8-diamino-4,4-dimethyloctane
1,6-diamino-2,4-diethylhexane
1,9-diamino-5-methylnonane As the diamine constituent unit [Y], particularly preferred are constituent units derived from aliphatic alkylenediamines of straight chain, and examples of such aliphatic alkylenediamines of straight chain include 1,4-diaminobutane, 1,6-diaminohexane, 1,8-diaminooctane, 1,10-diaminodecane, 1,12-diaminododecane and a mixture thereof. Of these, most preferred is 1,6-diaminohexane.

The alicyclic alkylenediamine constituent unit is a constituent unit derived from diamine generally having 6-25 carbon atoms and containing at least one alicyclic hydrocarbon ring.

As the alicyclic alkylenediamine constituent unit, there can be mentioned those derived from for example the following alicyclic alkylenediamines:
1,3-diaminocyclohexane
1,4-diaminocyclohexane
1,3-bis(aminomethyl)cyclohexane
1,4-bis(aminomethyl)cyclohexane
isophoronediamine
piperazine
2,5-dimethylpiperazine
bis(4-aminocyclohexyl)methane
bis(4-aminocyclohexyl)propane
4,4'-diamino-3,3'-dimethyldicyclohexylpropane
4,4'-diamino-3,3'-dimethyldicyclohexylmethane
4,4'-diamino-3,3'-dimehtyl-5,5'-dimethyldicyclohexylmethane
4,4'-diamino-3,3'-dimethyl-5,5'-dimethyldicyclohexylpropane
α,α'-bis(4-aminocyclohexyl)-p-diisopropylbenzene
α,α'-bis(4-aminocyclohexyl)-m-diisopropylbenzene
α,α'-bis(4-aminocyclohexyl)-1,4-cyclohexane
α,α'-bis(4-aminocyclohexyl)-1,3-cyclohexane Among the alicyclic alkylenediamine constituent units, preferred are constituent units derived from alicyclic alkylenediamines such as bis(aminomethyl)cyclohexane, bis(4-aminocyclohexyl)methane and 4,4'-diamino-3,3'-dimethyldicyclohexylmethane, and more preferred are constituent units derived from alicyclic alkylenediamines such as bis(4-aminocyclohexyl)methane, 1,3-bis(aminocyclohexyl)methane and 1,3-bis-(aminomethyl)cyclohexane.

As the alkylenediamines used for deriving the diamine constituent unit [Y], aliphatic alkylenediamines or alicyclic alkylenediamines can be employed singly or in combination.

The aromatic polyamide [I] can be prepared by known processes.

For example, as described in Polymer Reviews, 10, Condensation Polymers by Interfacial and Solution Methods (by P. W. Morgan), Inter-Science Publishers (1965) or Markromol. Chem., 47, 93-113, (1961), diacidic halide of an aromatic dicarboxylic acid capable of deriving the aforementioned constituent unit of the aromatic polyamide [I] is subjected to polycondensation with diamine through a solution method to prepare an aromatic polyamide [I]. Otherwise, the aromatic polyamide [I] can be prepared by utilizing interfacial polymerization.

Further, the aromatic polyamide [I] can be also obtained by subjecting an aromatic dicarboxylic acid corresponding to the aromatic dicarboxylic acid constituent unit and diamine corresponding to the diamine constituent unit, or the salt of the aromatic dicarboxylic acid and the diamine to polycondensation through a fusion method in the presence or absence of a solvent such as water.

Moreover, the aromatic polyamide [I] can be also obtained by producing an oligomer utilizing the above solution method and then subjecting the oligomer to polycondensation through solid phase polymerization.

The diamine constituent unit which forms the aromatic polyamide employable in the invention may contain an aromatic diamine constituent unit in addition to the aforementioned alkylenediamine constituent unit. As the aromatic diamine constituent unit, there can be mentioned constituent units derived from aromatic diamines such as m-xylylenediamine and p-xylylenediamine. These aromatic diamines can be employed singly or in combination.

The polyamide employable in the invention may be a polyamide containing a recurring unit having the formula [I-a], a recurring unit having the formula [I-b] and a recurring unit [I-c], or may be a mixture of a polyamide mainly containing a recurring unit having the formula [I-a], a polyamide mainly containing a recurring unit having the formula [I-b] and a polyamide mainly containing a recurring unit having the formula [I-c].

Among mixtures of plural polyamides, preferably employed is a mixture having a composition composed of a polyamide mainly containing a recurring unit having the formula [I-a] and at least one of a polyamide mainly containing a recurring unit having the formula [I-b] and a polyamide mainly containing a recurring unit having the formula [I-c]. In this case, the polyamide mainly containing a recurring unit having the formula [I-a] is generally contained in the composition in an amount of not less than 30% by weight. Further, a ratio between the polyamide mainly containing a recurring unit having the formula [I-b] and the polyamide mainly containing a recurring unit having the formula [I-c] is generally in the range of 0:100 to 40:60, preferably 0:100 to 30:70, by weight.

Of the above aromatic polyamides [I], the preferred aromatic polyamide in the third thermoplastic resin composition contains the terephthalic constituent unit (a) in an amount of 30 to 100% by mole, and the aromatic dicarboxylic acid constituent unit (b) other than the terephthalic acid constituent unit in an amount of 0 to 70% by mole and/or the aliphatic dicarboxylic acid constituent unit (c) in an amount of 0 to 70% by mole, based on 100% by mole of the dicarboxylic acid constituent unit [X].

The polyamide resins employable in the third thermoplastic resin composition of the invention generally has an intrinsic viscosity $[\eta]$, measured in a concentrated sulfuric acid at 30° C., of 0.5 to 3.0 dl/g, preferably 0.5 to 2.8 dl/g, more preferably 0.6 to 2.5 dl/g. Especially in the case of using a polyamide resin having an intrinsic viscosity $[\eta]$, measured in a concentrated sulfuric acid at 30° C., of not less than 0.85 dl/g, a flame-retardant resin composition of high heat resistance can be obtained.

The polyamide resin preferably employed in the third thermoplastic resin composition of the invention has a melting point (Tm) of 28° to 350° C., preferably 300° to 350° C. If a polyamide resin having a melting temperature (Tm) thin the above range is used, a flame-retardant resin composition suitable for forming a molded product having high heat resistance can be obtained.

Examples of such resins include nylon 6TI (terephthalic acid: 35% by mole, isophthalic acid: 15% by mole, hexamethylenediamine: 50% by mole, $[\eta]=0.94$ dl/g, Tm=321° C.), nylon 6TI-2 (terephthalic acid: 40% by mole, isophthalic acid: 10% by mole, hexamethylenediamine: 50% by mole, $[\eta]=1.32$ dl/g, Tm=343° C.), nylon 6T6 (terephthalic acid: 27.5% by mole, adipic acid: 22.5% by mole, hexamethylenediamine: 50% by mole, $[\eta]=1.02$ dl/g, Tm=312° C.), and nylon 6TI10 (terephthalic acid: 35% by mole, isophthalic acid: 10% by mole, sebacic acid: 5% by mole, hexamethylenediamine: 50% by mole, $[\eta]=1.18$ dl/g, Tm=316° C.).

In the fourth and fifth thermoplastic resin compositions of the invention, the aromatic polyamide contains the terephthalic constituent unit (a) in an amount of 20 to 100% by mole, preferably 25 to 80% by mole, and the aromatic dicarboxylic acid constituent unit (b) other than a terephthalic acid constituent unit and/or the aliphatic dicarboxylic acid constituent unit (c) in an amount of 0 to 80% by mole, preferably 20 to 75% by mole, based on 100% by mole of the dicarboxylic acid constituent unit [X].

In the case that the aromatic polyamide [I] contains the terephthalic acid constituent unit and the aromatic dicarboxylic acid constituent unit other than the terephthalic constituent unit and/or the aliphatic dicarboxylic acid constituent unit in the above-mentioned amounts, as the dicarboxylic acid constituent unit [X], and further contains a diamine constituent unit (described later), there can be obtained a resin composition capable of producing a molded product particularly excellent in heat-resistant properties (e.g., heat aging characteristics and heat distortion properties), mechanical properties (e.g., tensile strength, flexural strength and abrasion resistance) and physicochemical properties (e.g., chemical resistance and water resistance).

In the fourth and fifth thermoplastic resin compositions of the invention, the aromatic polyamides have an intrinsic viscosity $[\eta]$, measured in a concentrated sulfuric acid, generally of 0.5 to 3.0 dl/g, preferably 0.6 to 2.8 dl/g, more preferably 0.6 to 2.5 dl/g.

The aromatic polyamide employable for the fourth and fifth thermoplastic resin compositions of the invention has a glass transition temperature (Tg) much higher than that of conventionally known polyamides. In detail, the glass transition temperature of the polyamide employable in the invention generally is in the range of 70° to 150 ° C., preferably 80° to 140° C. In general, the glass transition temperature thereof is higher than the prior polyamide, for example, being higher than nylon 6,6 by 20° to 100° C.

The above-described thermoplastic resins employable in the invention preferably have such a molecular-weight distribution that various molding methods such as extrusion molding, injection molding, blow molding and stamping can be readily conducted.

The first to fifth thermoplastic resin compositions of the invention further contain at least any one of an organic compound (e.g., a halogenated organic compound and modified polyolefin), an antimony-containing compound, a phosphorus-containing compound, an aromatic amine-type stabilizer and an organic phosphite-type stabilizer, in addition to the above-mentioned thermoplastic resin.

Concretely, the first thermoplastic resin composition of the invention further contains a halogenated organic compound, an antimony-containing compound and a phosphorus-containing compound in addition to the thermoplastic resin.

As the halogenated organic compound employable for the thermoplastic resin compositions of the invention, there can be mentioned a brominated crosslinking aromatic polymer as described in Japanese Patent Provisional Publication No. 63(1988)-317552, brominated polystyrene, a brominated polyphenylene ether, a brominated styrene/maleic anhydride copolymer (brominated SMA resin), a brominated epoxy resin, a brominated phenoxy resin, a decabromodiphenyl ether, decabromobiphenyl, brominated polycarbonate and perchloropentadecane. Concretely, there can be employed, for example, EBR-370 FK ® (trade name of Matsunaga Chemical Co., Ltd.) as the brominated crosslinking aromatic polymer, Pyrocheck 68PB (trade name of Nissan Ferro Organic Chemical Co., Ltd.) as the brominated polystyrene, and PO64P (trade name of Great Lake Co.) as the brominated polyphenylene ether. These halogenated organic compounds can be employed singly or in combination.

The bromine content of the halogenated organic compounds preferably is in the range of 15 to 87%.

The above-mentioned halogenated organic compound is used in an amount of 1 to 40 parts by weight, preferably 10 to 30 parts by weight, in terms of halogen atom, per 100 parts by weight of the aforementioned thermoplastic resin.

As the antimony-containing compound used in the first thermoplastic resin compositions of the invention, there can be mentioned known antimony-containing compounds such as antimony trioxide, antimony pentaoxide, antimony tartrate and sodium antimonate. These antimony-containing compounds can be employed singly or in combination.

The antimony-containing compound is used in an amount of 1 to 30 parts by weight, preferably 3 to 20 parts by weight, in terms of antimony atom, per 100 parts by weight of the aforementioned thermoplastic resin.

The first thermoplastic resin composition of the invention further contains a phosphorus-containing compound in addition to the aforementioned thermoplastic resin, halogenated organic compound and antimony-containing compound. By addition of the phosphorus-containing compound, the obtained resin composition can be enhanced in the granulation properties, and further a molded product formed from the resin composition can be improved in the color shades. Moreover, even if the phosphorus-containing compound is added, various properties inherently belonging to the resin itself, such as heat resistance and flame retardance, are never lowered.

As the phosphorus-containing compound, there can be mentioned various phosphorus-containing compounds such as phosphates, organic phosphates, mixtures of phosphates and organic phosphates, and metal salts synthesized from mixed acids of phosphorus-containing inorganic acids and organic acids. These compounds can be employed singly or in combination.

Examples of the phosphates include metal (e.g., Li, Na, K, Mg, Ca, Sr, Zn and Al) salts of phosphoric, phosphorus or hydrophosphorous acids. These phosphates can be employed singly or in combination.

Concrete examples of the phosphates are as follows.

Sodium salts such as sodium dihydrogenphosphate, disodium hydrogenphosphate, sodium phosphate, sodium hydrogenphosphite, sodium phosphite and sodium hypophosphite;

potassium salts such as potassium dihydrogenphosphate, dipotassium hydrogenphosphate, potassium phosphate, potassium hydrogenphosphite, potassium phosphite and potassium hypophosphite;

lithium salts such as lithium dihydrogenphosphate, dilithium hydrogenphosphate, lithium phosphate, lithium hydrogenphosphite, lithium phosphite and lithium hypophosphite;

barium salt such as barium dihydrogenphophate, dibarium hydrogenphosphate, barium phosphate and barium hypophosphite;

magnesium salts such as magnesium hydrogenphosphate, magnesium dihydrogenphosphate, magnesium phosphate and magnesium hypophosphite;

calcium salts such as calcium dihydrogenphosphate, calcium hydrogenphosphite, calcium phosphate and calcium hypophosphite;

zinc salts such as zinc phosphite and zinc hypophosphite; and aluminum salts such as aluminium phosphite and aluminum hypophosphite.

Examples of the organic phosphates include metal (e.g., Li, Na, K, Mg, Ca, Sr, Zn and Al) salts of alkylphosphoric or alkylphosphorous esters and those of alkyletherphosphoric or alkyletherphosphorous esters. These organic phosphates can be employed singly or in combination.

Examples of the metal salts of alkylphosphoric esters include metal salts of monoalkyl esters represented by the formula, $PO(OR)(OH)_2$, and metal salts of dialkyl esters represented by the formula, $PO(OR)_2OH$.

Concrete examples of the monoalkyl esters represented by the formula, $PO(OR)(OH)_2$, include ethyllithium phosphate, butylsodium phosphate, 2-ethylhexylbarium and dodecylmagnesium phosphate. Concrete examples of the metal salts of dialkyl esters represented by the formula, $PO(OR)_2OH$, include diethylsodium phosphate, dibutylpotassium phosphate, di(2-ethylhexyl)barium phosphate, dioctylmagnesium phosphate, dihexylcalcium phosphate and didodecyllithium phosphate.

Examples of the metal salts of alkylphosphorous esters include metal salts of monoalkyl esters represented by the formula, $P(OR)(OH)_2$, or metal salts of dialkyl esters represented by the formula, $P(OR)_2OH$.

Concrete examples of the metal salts of monoalkyl esters represented by the formula, $P(OR)(OH)_2$, include ethylsodium phosphite, butylcalcium phosphite, (2-ethylhexyl)barium phosphite, octylpotassium phosphite and decylmagnesium phosphite. Concrete examples of the metal salts of dialkyl esters represented by the formula, $P(OR)_2OH$, include diethylsodium phosphite, dibutylcalcium phosphite, dihexylbarium phosphite, dioctylmagnesium phosphite, di(2-ethylhexyl)barium phosphite and didodecylpotassium phosphite.

Also employable as the phosphorus-containing compound in the invention are metal salts synthesized from mixed acids of phosphorus-containing inorganic acids and organic acids.

Examples of the phosphorus-containing inorganic acids employable in the invention include hydrophosphorous acid, phosphorus acid and phosphoric acid. Examples of the organic acids employable in the invention include acetic acid, propionic acid, butyric acid, caprylic acid, capric acid, 2-ethylhexoic acid, lauric acid, stearic acid, isostearic acid, 12-hydroxystearic acid, oleic acid, linoleic acid, linolenic acid, thioglycolic acid, mercaptopropionic acid, lauryl mercaptopropionic acid, benzoic acid, paratertiarybutyl benzoic acid, dimethyl benzoic acid, aminobenzoic acid, salicylic acid, aminoacetic acid, glutamic acid, oxalic acid, succinic acid, adipic acid, phthalic acid, maleic acid, thiodipropionic acid, fumaric acid, malonic acid, malic acid, tartaric acid and citric acid.

In the mixed acid of the phosphorus-containing inorganic acid and the organic acid, the content of the organic acid is in the range of 0.1 to 50% by weight. Each of the phosphorus-containing inorganic acids and the organic acids can be employed singly or in combination.

As the metal or metal compound employable for synthesizing metal salts using mixed acids of the phosphorus-containing inorganic acid and the organic acid, there can be mentioned metals such as Na, K, Mg, Ca, Sr, Ba, Zn, Al and Zr; and metal compounds thereof. Each of these metals and metal compounds can be employed singly or in combination. In the metal salts, the amount of the metal is in the range of 1 to 3 moles per 1 mole of the acid. The metal salt may be a basic acid.

The above-described phosphorus-containing compound is employed in an amount of 0.1 to 10 parts by weight, preferably 0.5 to 5 parts by weight, per 100 parts by weight of the aforementioned thermoplastic resin.

The second thermoplastic resin composition of the invention further contains an amine-type stabilizer and/or a phosphorus-type stabilizer in addition to the same thermoplastic resin, halogenated organic compound, antimony-containing compound and phosphorus-containing compound as those of the above-mentioned first thermoplastic resin composition.

In the second thermoplastic resin composition of the invention, the halogenated organic compound, antimony-containing compound and phosphorus-containing compound are used in the same amounts as those in the first thermoplastic resin composition.

As the amine-type stabilizer, preferably employable are aromatic amine-type stabilizers having the following formula (III-a) or the following formula (III-b):

ti R$^1$—NH—R$^2$              (III-a)

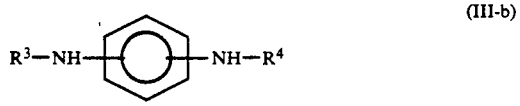
(III-b)

In the formula (III-a) and the formula (III-b), each of R1 to R4 represents an alkyl group (e.g., octyl group), an aromatic group (e.g., phenyl group and naphtyl group), an aromatic group having one or more alkyl groups (e.g., octylphenyl group, dimethylbenzyl group) or a methacryloyloxy group.

Examples of the aromatic amine-type stabilizers having the formula (III-a) include p,p'-dioctyldiphenylamine, 4,4'-bis($\alpha$,$\alpha$-dimethylbenzyl)diphenylamine and phenyl-$\alpha$-naphthylamine.

Examples of the aromatic amine-type stabilizers having the formula (III-b) include N,N'-diphenyl-p-phenylenediamine, N-phenyl-N'-(3-methacryloyloxy-2-hydroxypropyl)-p'-phenylenediamine and N,N'-di-$\beta$-naphthyl-p-phenylenediamine.

Also employable are other amine-type stabilizers such as a 2,2,4-trimethyl-1,2-dihydroquinoline polymer.

Those amine-type stabilizers can be employed singly or in combination.

As the phosphorus-type stabilizer employable for the second thermoplastic resin composition of the invention, there can be mentioned, for example, bis(2,6-di-t-butyl-4-methylphenyl)pentaerythritol-di-phosphite, bis(2,4-di-t-butylphenyl)pentaerythritol-di-phosphite, tris(2,4-di-t-butylphenyl)phosphite and tetrakis(2,4-di-t-butylphenyl)4,4'-biphenylenediphosphonite. These phosphorus-type stabilizers can be employed singly or in combination.

The second thermoplastic resin composition of the invention contains the amine-type stabilizer and/or the phosphorus-type stabilizer in an amount of 0.05 to 7 parts by weight, preferably 0.1 to 3 parts by weight, more preferably 0.5 to 2 parts by weight, per 100 parts by weight of the aforementioned polyamide resin.

By adding the amine-type stabilizer and/or the phosphorus-type stabilizer to the resin composition composed of the above-mentioned polyamide resin, halogenated organic compound, antimony-containing compound and phosphorus-containing compound, the resin composition can be prevented from decomposition thereof, whereby occurrence of mold-staining can be remarkably reduced even when the resin composition is continuously subjected to injection molding for a long period of time.

The third thermoplastic resin composition of the invention further contains a brominated compound of a copolymer formed from an aromatic vinyl monomer and an $\alpha$,$\beta$-unsaturated (di)carboxylic acid in addition to the thermoplastic resin, specifically polyamide.

Examples of the aromatic vinyl monomers include styrene, $\alpha$-methylstyrene, o-methylstyrene, m-methylstyrene, p-methylstyrene, t-butylstyrene, $\alpha$-methylvinyltoluene, dimethylstyrene, chlorostyrene, dichlorstyrene, bromostyrene, dibromostyrene and vinylnaphthalene. These aromatic vinyl monomers can be employed singly or in combination.

Examples of the $\alpha$,$\beta$-unsaturated (di)carboxylic acids include an acrylic acid, a methacrylic acid, a maleic acid, a fumaric acid, an itaconic acid, a citraconic acid and a 3,6-endomethylene-1,2,3,6-tetrahydro-cis-phthalic acid (trade name: nadic acid).

Anhydrides of the above-mentioned $\alpha$,$\beta$-unsaturated (di)carboxylic acids can be also employed in the invention. The $\alpha$,$\beta$-unsaturated (di)carboxylic acids or anhydrides thereof can be employed singly or in combination.

The brominated compounds employable for the flame retardant resin compositions of the invention are brominated compounds of copolymers formed from the above-mentioned aromatic vinyl monomers and the above-mentioned $\alpha$,$\beta$-unsaturated (di)carboxylic acids.

The brominated compounds can be obtained by beforehand brominating the aromatic vinyl monomers and/or the $\alpha$,$\beta$-unsaturated (di)carboxylic acids (i.e., starting materials) and then causing them to react with each other. However, they can be preferably prepared by initially causing the aromatic vinyl monomers to react with the $\alpha$,$\beta$-unsaturated (di)carboxylic acids and then brominating the reaction product by using a brominating agent.

As the brominating agent employable for brominating copolymers of the aromatic vinyl monomers and the $\alpha$,$\beta$-unsaturated (di)carboxylic acids, there can be mentioned for example brominated sulfuryl and molecular bromine. In the bromination procedure, brominated catalysts such as ferric chloride and aluminum chloride can be employed according to the necessity.

In the invention, it is desired to use a brominated compound of a copolymer of the aromatic vinyl monomer and the $\alpha$,$\beta$-unsaturated (di)carboxylic acid in which the bromine content is not less than 40% by weight, preferably in the range of 60 to 80% by weight. By the use of the brominated compound having such bromine content, the resulting polyamide resin composition can be much highly enhanced in the flame retardance.

In the third thermoplastic resin compositions, among the various brominated compounds, a brominated compound of a styrene/maleic anhydride copolymer is particularly preferably employed.

The thermoplastic resin composition containing the above-mentioned specific brominated compound according to the invention can provide a molded product having high flame retardance owing to the specific brominated compound, and the composition can be favorably employed for forming electronic components suitable for the aforementioned reflow-soldering.

In the third thermoplastic resin composition of the invention, a ratio between the polyamide resin and the brominated compound is generally in the range of 90:10 to 50:50, preferably 80:20 to 60:40, more preferably 75:25 to 65:35, by weight. The resin composition having the above-mentioned ratio between the polyamide resin and the brominated compound shows excellent flame retardance, and such resin composition can produce electronic components particularly suitable for the reflow-soldering.

To the third thermoplastic resin compositions in the invention can be added flame-retardants according to the necessity. Examples of the flame-retardants include antimony-containing compounds (e.g., antimony trioxide, antimony pentaoxide, sodium antimonate and antimony tartrate), zirconium oxide, hydrated alumina, zinc borate, barium metaborate, organic peroxide and ammonium polyphosphate. Of these, antimony-containing compounds (specifically, antimony trioxide and/or sodium antimony) are preferred.

The flame-retardant is generally used in an amount of not more than 25 parts by weight, preferably 1 to 20 parts by weight, more preferably 5 to 15 parts by weight, per 100 parts by weight of the aforementioned polyamide resin.

The fourth thermoplastic resin composition of the invention further contains an aromatic amine-type stabilizer [III] and an organic phosphite-type stabilizer [IV], in addition to the aforementioned thermoplastic resin, specifically aromatic polyamide [I].

The fifth thermoplastic resin composition of the invention contains modified polyolefin [II], an aromatic amine-type stabilizer [III] and an organic phosphite-type stabilizer [IV], in addition to the above aromatic polyamide [I].

As the aromatic amine-type stabilizer, the aforementioned aromatic amine-type stabilizers having the formula [III-a] or formula [III-b], and 2,2,4-trimethyl-1,2-dihydroxyuninoline copolymer can be employed. Of these, preferred are aromatic amine-type stabilizers having the formula [III-a], and among them, 4,4'-bis-(α,α-dimethylbenzyl)diphenylamine and N,N'-di-2-naphthyl-p-phenylenediamine are preferably employed.

In the fourth and fifth thermoplastic resin compositions, it is desired that the aromatic amine-type stabilizer is contained in the polyamide resin composition in an amount of 0.05 to 5 parts by weight, preferably 0.1 to 2 parts by weight, more preferably 0.2 to 1 part by weight, in 100 parts by weight of the polyamide resin. If the amount of the aromatic amine-type stabilizer is less than 0.05 parts by weight, heat stability of the resulting composition cannot be sufficiently improved. If the amount thereof exceeds 5 parts by weight, the physical properties of the resulting composition tend to deteriorate, or molded products formed from the resulting composition tend to show bad appearance because of the oozing of the stabilizer.

The fourth and fifth thermoplastic resin compositions of the invention furthermore contains an organic phosphite-type stabilizer [IV] besides the aromatic amine-type stabilizer [III].

The organic phosphite-type stabilizer [IV] and the aromatic amine-type stabilizer [III] work synergistically to improve heat resistance of the resin during the molding stage.

Examples of the organic phosphite-type stabilizers are as follows.
trioctyl phosphite,
trilauryl phosphite,
tridecyl phosphite,
octyldiphenyl phosphite,
trisisodecyl phosphite,
phenyldiisooctyl phosphite,
phenyldiisodecyl phosphite,
phenyldi(tridecyl) phosphite,
diphenylisooctyl phosphite,
diphenylisodecyl phosphite,
diphenyltridecyl phosphite,
triphenyl phosphite,
tris(nonylphenyl) phosphite,
distearylpentaerythritol diphosphite,
tris(2,4-di-t-butylphenyl phosphite),
tris(butoxyethyl) phosphite,
tetratridecyl-4,4'-butylidenebis(3-methyl-6-t-butylphenol)-diphosphite,
4,4-isopropylidene-diphenolalkyl phosphite (provided that the alkyl groups has about 12 to 15 of carbon atoms),
4,4'-isopropylidenbis(2-t-butylphenol)-di(nonylphenyl) phosphite,
tris(biphenyl) phosphite,
tetra(tridecyl)-1,1,3-tris(2-methyl-5-t-butyl-4-hydroxyphenyl)butane phosphite,
tetra(tridecyl)-4,4'-butylidenebis(3-methyl-6-t-butylphenol) diphosphite
tetraalkyl-4,4'-isopropylidenediphenyl disphosphate (provided that each of the alkyl groups has 1 to 15 of carbon atoms),
tris(nonylphenyl) phosphite (provided that each of nonylphenyl groups is mono- or di-nonylphenyl group),
phenyl-4,4'-isopropylidenephenol-pentaerythritol disphosphite,
di(nonylphenyl)pentaerythritol diphosphite,
4,4'-isopropylidenebis(2-t-butylphenol)-di(nonylphenyl) phosphite,
9,10-di-hydro-9-oxa-9-oxa-10-phosphaphenanthlene-10-oxide,
tris(3,5-di-t-butyl-4-hydroxyphenyl) phosphite,
hydrogenated-4,4'-isopropylidene-phenol polyphosphite,
bis(octylphenyl)-bis[4,4'-butylidene-bis(3-methyl-6-t-butylphenol)]-1,6-hexanol diphosphite,
hexatridecyl-1,1,3-tris(2-methyl-4-hydroxy-5-t-butylphenol) disphosphite,
tris[4,4'-isopropylidenebis(2-t-butyl-phenol)]phosphite,
tris(1,3-distearoyloxyisopropyl) phosphite,
9,10-dihydro-9-phosphaphenanthrene-10-oride, and tetrabis(2,4-di-t-butylphenyl) pentaerithritoldiphosphite.

Also employable is bis(dialkylphenyl)pentaerythritol diphosphite. The bis(dialkylphenyl)pentaerythritol diphosphite is classified into two types. One is a spiro type having the following formula (IV-1), and the other is a cage type having the following formula (IV-2). These two types of the diphosphites can be employed singly or in the form of mixture thereof. Generally, a mixture of both isomers is preferably employed from the economical viewpoint for producing phosphite esters:

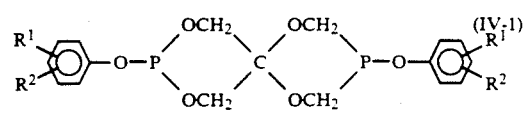

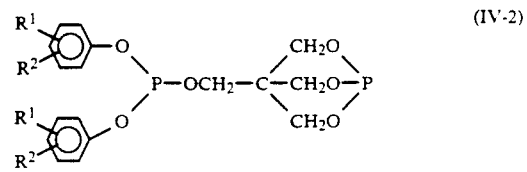

In the formula (IV-1) and the formula (IV-2), each of $R^1$ and $R^2$ preferably is an alkyl group having 1-9 carbon atoms, specifically, a branched alkyl group having the same carbon atoms, more specifically, a tert-butyl group. Further, it is most preferred that each of $R^1$ and $R^2$ is located at the second, fourth or sixth position of the phenyl group of the formula (IV-1) or (IV-2). Preferred examples of the phosphite esters having the formula (IV-1) or the formula (IV-2) include bis(2,4-di-t-butylphenyl)pentaerythritoldiphosphite and bis(2,6-di-t-butyl-4-methylphenyl)pentaerythritoldiphosphite. As other preferred phosphite esters, there can be mentioned phosphonites in which carbon and phosphorus are directly bonded to each other, for example, tetrakis(2,4-di-t-butylphenyl)4,4-biphenylenediphosphonite. The organic phosphite-type stabilizers can be employed singly or in combination.

As described above, the organic phosphite-type stabilizer and the aromatic amine-type stabilizer are employed for the fourth and the fifth thermoplastic resin compositions of the invention. For example, it is particularly preferred to use a phosphite ester such as bis(2,4-di-t-butylphenyl)pentaerythritoldiphosphite, bis(2,6-di-t-butyl-4-methylphenyl)pentaerythritoldiphosphite or tetrakis(2,4-di-t-butylphenyl)-4,4-biphenylenediphosphonite as the organic phosphite stabilizer, and to use an aromatic amine-type stabilizers having the formula (III-a) such as p,p'-dioctyldiphenylamine, 4,4'-bis($\alpha,\alpha$-dimethylbenzyl)diphenylamine or N,N'-di-2-naphtyl-p-phenylenediamine as the aromatic amine-type stabilizer, in combination.

When those two kinds of stabilizers [III] and [IV] are used in combination as described above, the resulting polyamide resin composition can be prominently enhanced in heat aging characteristics (e.g., tensile elongation with time and flexural strength with time) and molding stability as well as in the mechanical, chemical or physical properties.

The aromatic amine-type stabilizer [III] and the organic phosphite-type stabilizer [IV], both added to the aromatic polyamide [I], presumably have the following correlation between them. That is, if the aromatic polyamide [I] is oxidized and deteriorated under heating to produce a radical, the aromatic amine-type stabilizer [III]traps thus produced radical to per se become an oxidate. The organic phosphite-type stabilizer [IV] reduces the oxide of the aromatic amine-type stabilizer to reproduce the aromatic amine-type stabilizer, and simultaneously decomposes the peroxide group having been produced in the polymer by oxidation, to stabilize the resin composition.

The organic phosphite-type stabilizer is generally contained in an amount of 0.05 to 5 parts by weight, preferably 0.1 to 2 parts by weight, more preferably 0.2 to 1 part by weight, in 100 parts by weight of the polyamide resin composition. If the organic phosphite-type stabilizer is used in the above-mentioned amount, the mechanical strength with time of the resulting resin composition can be prevented from lowering even in an atmosphere of high temperatures.

If the amount of the organic phosphite-type stabilizer is less than 0.05 part by weight, the resin composition cannot be sufficiently improved in the heat stability. If the amount thereof exceeds 5 parts by weight, the physical properties of the resin composition lowers, and thereby the organic phosphite-type stabilizer tends to ooze from a molded product formed from the composition to spoil an appearance of the molded product.

Further, the total amount of the organic phosphite-type stabilizer and the aromatic amine-type stabilizer contained in 100 parts by weight of the polyamide resin composition is in the range of 0.1 to 5 parts by weight, preferably 0.2 to 2 parts by weight. When those two kinds of stabilizers are contained in the total amount of not less than 0.1 part by weight, the resulting resin composition can be remarkably improved in the heat aging characteristics and the molding properties.

The fifth thermoplastic resin composition of the invention will be described in detail hereinafter.

The fifth thermoplastic resin composition further contains modified polyolefin [II] (also referred to as "graft-modified $\alpha$-olefin polymer") in addition to the three components contained in the above-mentioned fourth polyamide resin composition, namely, aromatic polyamide [I], aromatic amine-type stabilizer [III] and organic phosphite-type stabilizer [IV].

The fifth thermoplastic resin composition containing the modified polyolefin [II] tends to have much higher impact strength and tensile elongation as compared with the aforementioned fourth thermoplastic resin composition.

The modified polyolefins employable in the invention include graft-modified compounds of crystalline polyolefins and graft-modified $\alpha$-olefin random elastic copolymers.

Examples of crystalline polyolefins employable for preparing graft-modified compounds of crystalline polyolefins include monopolymers of $\alpha$-olefins having 2-20 carbon atoms and copolymers thereof. Concrete examples of the crystalline polyolefins include polyethylene, polypropylene, linear low-density polyethylene (LLDPE) and ultra low-density polyethylene (VLDPE). These polyolefins have relatively high crystallizability (crystallinity: approx. 20-80%).

The crystalline polyolefin is subjected to graft-modification in the same manner as described later to obtain a graft-modified $\alpha$-olefin polymer. The modified polyolefin has almost the same crystallinity as that of polyolefin which is a starting material of the modified polyolefin. The crystallinity of the modified polyolefin generally is more than 20%, preferably in the range of 30 to 80%.

The intrinsic viscosity [$\eta$] of the modified polyolefin as measured in decalin at 135° C. generally is in the range of 0.05 to 8 dl/g, preferably 1 to 5 dl/g.

The graft-modified $\alpha$-olefin random elastic copolymer also employable as the modified polyolefin in the invention is a graft-modified compound of a copolymer in which two kinds of recurring units derived from different $\alpha$-olefins are arranged at random. Examples of the graft-modified $\alpha$-olefin random elastic copolymers include a graft modified ethylene/$\alpha$-olefin copolymer rubber (i) prepared by using ethylene as a base monomer and a graft modified propylene/$\alpha$-olefin copolymer rubber (ii) prepared by using propylene as a base monomer.

The graft-modified $\alpha$-olefin random elastic copolymer is a low-crystalline to non-crystalline copolymer, and preferably is substantially non-crystalline. In detail, the crystallinity of the copolymer measured by means of X-ray diffractometry is not more than 10%, preferably not more than 5%, more preferably 0%. Therefore, most of the graft modified $\alpha$-olefin random elastic copolymers do not have a definite melting point. Further, the graft-modified $\alpha$-olefin random elastic copolymer is soft because of the low crystallinity, and the modulus in tension of the copolymer generally is in the range of 0.1 to 20,000 kg/cm$^2$, preferably 1 to 15,000 kg/cm$^2$.

A melt index (measured at 190° C.) of the graft-modified $\alpha$-olefin random elastic copolymer generally is in the range of 0.1 to 30 g/10 min, preferably 1.0 to 20 g/10 min, more preferably 2.0 to 15 g/10 min, and a value of Mw/Mn (measured by GPC) thereof generally is not more than 5.5, preferably not more than 4.5, more preferably not more than 3.5.

A glass transition temperature of the graft-modified α-olefin random elastic copolymer generally is in the range of −150° to +50° C., preferably −80° to −20° C. The intrinsic viscosity [η] of the elastic copolymer as measured in decalin at 135° C. generally is in the range of 0.2 to 10 dl/g, preferably 1 to 5 dl/g, and a density thereof generally is in the range of 0.82 to 0.96 g/cm$^3$, preferably 0.84 to 0.92 g/cm$^3$.

The graft-modified ethylene/α-olefin copolymer rubber (i) and the graft-modified propylene/α-olefin copolymer rubber (ii), which are representative examples of the graft-modified α-olefin random elastic copolymer, will be described in more detail below.

Examples of α-olefins constituting the graft-modified ethylene/α-olefin copolymer rubber (i) are α-olefins having 3–20 carbon atoms such as propylene, butene-1, pentene-1, hexene-1, 4-methylpentene-1, octene-1, decene-1 and mixtures thereof. Of these, particularly preferred are propylene and/or butene-1.

Examples of α-olefins constituting the graft-modified propylene/α-olefin copolymer rubber (ii) are α-olefins having 4–20 carbon atoms such as butene-1, pentene-1, hexene-1, 4-methylpentene-1, octene-1, decene-1 and mixtures thereof. Of these, particularly preferred is butene-1.

The α-olefin random elastic copolymer forming the graft-modified α-olefin random elastic copolymer may contain other constituent units than those derived from α-olefins, such as constituent units derived from diene compounds, provided that the properties of the α-olefin random elastic copolymer is not spoiled.

Examples of the constituent units which can be contained in the α-olefin random elastic copolymer include constituent units derived from chain conjugated dienes such as 1,4-hexadiene, 1,6-octadiene, 2-methyl-1,5-hexadiene, 6-methyl-1,5-heptadiene and 7-methyl-1,6-octadiene; constituent units derived from cyclic conjugated dienes such as cyclohexadiene, dicyclopentadiene, methyltetrahydraindene, 5-vinylnorbornene, 5-ethylidene-2-norbornene, 5-methylene-2-norbornene, 5-isopropyridene-2-norbornene and 6-chloromethyl-5-isopropenyl-2-norbornene; constituent units derived from diene compounds such as ethylidene-3-isopropylidene-5-norbornene and 2-propenyl-2,2-norbornadiene; and constituent units derived from cyclic olefins.

The content of the above-mentioned diene constituent units in the α-olefin random elastic copolymer forming the graft-modified α-olefin random elastic copolymer is generally not more than 10% by mole, preferably not more than 5% by mole.

A molar ratio of ethylene to α-olefin (ethylene/α-olefin) in the graft-modified ethylene/α-olefin copolymer rubber (i) varies depending on the kind of α-olefin, but generally is in the range of 1/99 to 99/1, preferably 50/50 to 95/5. If propylene is used as the α-olefin, the molar ratio thereof preferably is in the range of 50/50 to 90/10, and if an α-olefin having 4 or more carbon atoms is used as the α-olefin, the molar ratio thereof preferably is in the range of 80/20 to 95/5.

Examples of the ethylene/α-olefin copolymers forming the graft-modified ethylene/α-olefin copolymer rubber (i) include copolymers of two-component system such as an ethylene/propylene copolymer, an ethylene/butene-1 copolymer, an ethylene/4-methylpentene-1 copolymer, an ethylene/hexene-1 copolymer, an ethylene/octene-1 copolymer and an ethylene/decene-1 copolymer; and copolymers of multicomponent system such as an ethylene/propylene/1,4-hexadiene copolymer, an ethylene/propylene/dicyclopentadiene copolymer, an ethylene/propylene/5-ethylidene-2-norbornene copolymer, an ethylene/propylene/2,5-norbornene copolymer, an ethylene/propylene/2,5-norbornadiene copolymer, an ethylene/butene-1/dicyclopentadiene copolymer, an ethylene/butene-1/1,4-hexadiene copolymer and an ethylene/butene-1/5-ethylidene-2-norbornene copolymer.

In the graft-modified propylene/α-olefin copolymer rubber (ii), a molar ratio of propylene to α-olefin (propylene/α-olefin) varies depending on the kind of α-olefin, but preferably is in the range of 50/50 to 95/5. If butene-1 is used as the α-olefin, the molar ratio thereof is preferably in the range of 50/50 to 90/10, and if an α-olefin having 5 or more carbon atoms is used as the α-olefin, the molar ratio thereof preferably is in the range of 80/20 to 95/5.

The graft-modified α-olefin random elastic copolymer employable for the fifth thermoplastic resin compositions of the invention can be prepared by subjecting the above-mentioned unmodified α-olefin random elastic copolymers to graft-modification using unsaturated carboxylic acids, unsaturated carboxylic anhydrides or unsaturated carboxylic acid derivatives.

Examples of the unsaturated carboxylic acids employable for the graft-modification include acrylic acid, methacrylic acid, α-ethylacrylic acid, maleic acid, fumaric acid, itaconic acid, citraconic acid, tetrahydrophthalic acid, methyltetrahydrophthalic acid, endocis-bicyclo[2,2,1]hepto-5-ene-2,5-dicarboxylic acid (nadic acid ®) and methyl-endocis-bicyclo-[2,2,1]hepto-5-ene-2,5-dicarboxylic acid (methylnadic acid ®). Examples of the unsaturated carboxylic anhydrides include maleic anhydride, citraconic anhydride, nadic anhydride and methylnadic anhydride. Examples of the unsaturated carboxylic acid derivatives include halide compounds of the above-mentioned unsaturated carboxylic acids (e.g., maleyl chloride), imide compounds of the above-mentioned unsaturated carboxylic acids (e.g., meleimide), and ester compounds of the above-mentioned unsaturated carboxylic acids (e.g., monomethyl maleate, dimethyl maleate and glycidyl maleate).

The above-described graft-modifiers can be employed singly or in combination.

Among the above graft-modifiers, preferred are unsaturated carboxylic anhydrides, specifically, maleic anhydride and nadic anhydride.

The unmodified α-olefin random elastic copolymer can be subjected to graft-polymerization using the graft modifier, for example, by a process of suspending or dissolving the α-olefin random elastic copolymer in a solvent and adding the graft-modifier to the resulting suspension or solution to perform a graft reaction, or a process of melting a mixture of the α-olefin random elastic copolymer and the graft-modifier to perform a graft reaction.

The amount of the graft-modifier used in the graft reaction is determined in consideration of its reactivity, and generally, the graft-modifier is used in an amount of 1 to 10 parts by weight per 100 parts by weight of the unmodified α-olefin random elastic copolymer to perform the graft reaction.

Through the above-mentioned graft reaction, there can be obtained a graft-modified α-olefin random elastic copolymer wherein the graft-modifier is contained in an amount of 0.01 to 10 parts by weight, preferably 0.05 to 5 parts by weight, per 100 parts by weight of the unreacted α-olefin random elastic copolymer.

In the graft reaction, a graft efficiency can be enhanced by the use of a radical initiator. As the radical initiator employable in the graft reaction, there can be mentioned conventional radical initiators such as organic peroxides, organic peresters and azo compounds. In the case of using the radical initiator, the amount thereof is generally in the range of 0.01 to 20 parts by weight per 100 parts by weight of the unmodified α-olefin random elastic copolymer.

Among the above-described various graft-modified α-olefin random elastic copolymers, preferably employable in the invention are a graft-modified ethylene/propylene random copolymer rubber and a graft-modified ethylene/α-olefin random copolymer rubber, both having an ethylene content of 35–50% by mole and being substantially non-crystalline. If those copolymer rubbers are used, the resulting molded product (specifically a connector thereof) can be efficiently prevented from lowering of strength which is caused by deterioration under heating.

As the graft-modified α-olefin random elastic copolymer, the above-mentioned graft-modified ethylene/α-olefin copolymer rubber (i) and graft-modified propylene/α-olefin copolymer rubber (ii) are generally employed singly or in combination. However, other polymers or other copolymers can be added to the graft-modified α-olefin random elastic copolymer, provided that the addition of other polymers or copolymers does not mar the properties of the graft-modified α-olefin random elastic copolymer.

Examples of other polymers or copolymers employable in the invention include aromatic vinyl hydrocarbon/conjugated diene copolymers and hydrogenated compounds thereof. Concrete examples of the aromatic vinyl hydrocarbon/conjugated diene copolymers or the hydrogenated compounds thereof include a styrene/butadiene copolymer rubber, a styrene/butadiene/styrene copolymer rubber, a styrene/isoprene block copolymer rubber, a styrene/isoprene/styrene block copolymer rubber, a hydrogenated styrene/butadiene/styrene block copolymer rubber and a hydrogenated styrene/isoprene/styrene block copolymer.

Among the above-mentioned modified polyolefins, namely, graft-modified α-olefin polymers, a graft-modified α-olefin random elastic copolymer is preferably employed in the invention. When the graft-modified α-olefin random elastic copolymer is used, there can be obtained a molded product which hardly suffers reduction of strength in the heating procedure.

In the fifth thermoplastic resin composition of the invention, the modified polyolefin [II] is contained in an amount of 2 to 40 parts by weight, preferably 5 to 20 parts by weight, in a total of 100 parts by weight of the aromatic polyamide [I] and the modified polyolefin [II]. When the content of the modified polyolefin [II] (i.e., graft-modified α-olefin random elastic copolymer) is in the range of 2 to 40 parts by weight, a resin composition capable of producing a molded product which hardly suffers reduction of strength in the heating procedure can be obtained.

In the fifth thermoplastic resin composition of the invention, it is desired that the aromatic amine-type stabilizer [III] is contained in an amount of 0.05 to 5 parts by weight, preferably 0.1 to 2 parts by weight, more preferably 0.2 to 1 part by weight, per 100 parts by weight of the resin composition. Further, it is also desired that the organic phosphite-type stabilizer [IV] is contained therein in an amount of 0.05 to 5 parts by weight, preferably 0.1 to 2 parts by weight, more preferably 0.2 to 1 part by weight, per 100 parts by weight of the resin composition.

When those two kinds of the stabilizers [III] and [IV] are used in combination, the resulting resin composition can be remarkably improved in the heat aging characteristics (e.g., tensile elongation with time and flexural strength with time) and molding stability as well as in the mechanical, chemical and physical properties.

In the fifth thermoplastic resin composition of the invention, it is desired that the total amount of the organic phosphite-type stabilizer and the aromatic amine-type stabilizer is in the range of 0.1 to 5 parts by weight, preferably 0.2 to 2 parts by weight, per 100 parts by weight of the thermoplastic resin composition. When the total amount thereof is not less than 0.1 part by weight, the resulting composition can be provided with sufficient heat aging characteristics and excellent molding properties. However, even if the total amount of the two kinds of stabilizers exceeds 5 parts by weight, the enhancement of the properties accompanied by the increase of the content cannot be expected so much.

The fifth thermoplastic resin composition of the invention generally has a heat distortion temperature (HDT) of 60° to 150° C., preferably 80° to 130° C., when measured under load of 18.6 kg/cm$^2$. The resin composition can show extremely high heat resistance although it is thermoplastic.

The essential components of the thermoplastic resin composition of the invention has been described. However, the first and second thermoplastic resin compositions of the invention may further contain a fibrous reinforcing agent in addition to the aforementioned components, namely, thermoplastic resin such as polyamide, halogenated organic compound, antimony-containing compound, phosphorus-containing compound, and, if necessary, amine-type stabilizer and/or phosphorus-type stabilizer. When the fibrous reinforcing agent is added to the resin composition, the resulting composition can be sometimes much more enhanced in various properties such as heat resistance, flame retardance, tensile rigidity strength, flexural strength and impact strength. As the fibrous reinforcing agent employable in the first and second thermoplastic composition of the invention, there can be employed inorganic fibrous reinforcing agents such as glass fibers, potassium titanate fibers, metal-coated glass fibers, ceramic fibers, wollastonite, carbon fibers, metal carbide fibers and hardened metal fibers. These fibrous reinforcing agents may be beforehand treated with silane compounds such as vinyltriethoxysilane, 2-aminopropyltriethoxysilane and 2-glycidoxypropyltrimethoxysilane. The inorganic fibrous reinforcing agents are preferred from the viewpoint of the heat resistance, and among them, glass fibers are particularly preferred because of excellent reinforcing effect.

The fibrous reinforcing agent is used in an amount of 0.5 to 300 parts by weight, preferably 10 to 150 parts by weight, per 100 parts by weight of the aforementioned thermoplastic resin composition.

The thermoplastic resin compositions of the invention may further contain various known additives other than the above-mentioned components, for example, a heat stabilizer, a weather stabilizer, a plasticizer, a thickening agent, an antistatic agent, a parting agent, a pigment, a dye, an inorganic or organic filler, a nucleating agent, and an inorganic compound (e.g., carbon black, talc, clay and mica), provided that those additives do not spoil the objects of the invention.

The first and second thermoplastic resin compositions of the invention may contain various polymers such as polyethylene, polypropylene, polybutene, polymethylpentene, polystyrene, an acrylonitrile/butadiene copolymer, polybutylene terephthalate, polyethylene terephthalate, a polyphenylene ether, a fluorine resin, a silicone resin, a phenol resin, polyphenylene sulfide and a liquid crystal polymer.

The first and second thermoplastic polyamide compositions of the invention can be prepared by known processes. For example, the aforementioned components, namely, polyamide, halogenated organic compound, antimony-containing compound, phosphorus-containing compound, and amine-type stabilizer and/or phosphorus-type stabilizer, and other additives if desired, are mixed with each other using an appropriate mixing machine such as Henschel mixer, a V-blender, a ribbon blender and a tumbling blender. Otherwise, the above-components are mixed with each other in the same manner as described above, then the mixture is melted and kneaded using a single screw extruder, a multiple screw extruder, a kneader, Banbury mixer or the like, and the kneadate is subjected to granulation or pulverization.

If necessary, the third thermoplastic resin compositions of the invention may contain other components than the above-mentioned essential components, such as a reinforcing filler (e.g., glass fibers, inorganic silicates, silica obtained with evaporation of silica gel, quartz, crystobaryta, clay, talc and asbestos), a heat stabilizer, a light stabilizer, an antioxidant, a plasticizer, a lubricant, and a coloring agent.

The above-mentioned various additives can be generally used in an amount of not more than 200 parts by weight, preferably 15 to 150 parts by weight, more preferably 35 to 100 parts by weight, per 100 parts by weight of the polyamide resin.

In the case that the flame-retardants or the additives are in the form of powder, the powdery flame-retardants or the powdery additives generally have a mean average particle diameter of 0.1 to 200 μm, preferably 1 to 100 μm.

The thermoplastic resin compositions of the invention can be prepared, for example, by kneading the polyamide resin and the brominated compound (and various flame-retardants and additives, if necessary) with keeping the polyamide resin and the brominated compound in the molten state. For kneading the components, a conventional kneading apparatus such as an extruder or a kneader can be employed.

Particularly, it is preferred to introduce a molten polyamide as a main feed into the kneading apparatus and simultaneously introduce the brominated compound as a side feed into the same apparatus, to get them together.

The third thermoplastic resin compositions of the invention prepared as above are processed into various forms such as a powdery form and a pellet form, and then subjected to various molding procedures such as compression molding, injection molding and extrusion molding, to produce a variety of molded products such as a housing for electronic components.

The third thermoplastic resin compositions of the invention are particularly suitable for materials for forming housings in which electronic components (e.g., diode, transistor, transistor effective in electric field, commutator, integrated circuit, resistor, rheostat, condenser, switch and connector) are soldered on a board under heating using infrared rays.

Fixing of the above-exemplified electronic components onto a printable wiring board utilizing infrared rays reflow-soldering can be done as follows. At first, a solder is dotted on a printable wiring board, and then the electronic components having a housing formed from the third thermoplastic resin composition of the invention is provisionally fixed to the board using an adhesive. In this procedure, terminals of the electronic components to be fixed are brought into contact with the dotted solder. Then, the board on which the electronic components are provisionally fixed as above is placed in an infrared rays-reflowing furnace. In the furnace, the board having the electronic component provisionally fixed thereon is irradiated with infrared rays to melt the solder, and thereby wires of the board and the terminals of the electronic components are soldered together.

The fourth thermoplastic resin composition of the invention contains the aforementioned components [I], [III] and [IV] as its essential components, and the fifth thermoplastic resin composition of the invention contains the aforementioned components [I], [II], [III] and [IV] its essential components, as described above. In addition to the components, those resin compositions may contain one or more of various additives such as inorganic or organic fillers, antioxidants, ultraviolet absorbents, light-protecting agents, phosphite stabilizers, peroxide-decomposing agents, basic assisting agents, nucleating agents, plasticizers, lubricants, antistatic agents, pigments and dyes, according to the necessity.

The fourth and fifth thermoplastic resin compositions of the invention may further contain other additives such as thermoplastic resins (e.g., polyethylene, polypropylene and polyethylene terephthalate), reinforcing agents (e.g., glass fiber, carbon fiber, boron fiber, silicon carbide fiber, asbestos fiber and metal fiber), and fillers (e.g., clay, silica, mica, graphite, glass beads, alumina, calcium carbonate, magnesium hydroxide and hydrotarside), in an appropriate amount.

Preferred examples of the fibers employable as the inorganic fillers include glass fibers and boron fibers. Of these, glass fibers are more preferred. By the use of the glass fibers, molded products formed from the obtained resin compositions can be enhanced in the mechanical properties such as tensile strength, flexural strength and flexural modulus, and heat resistance such as heat distortion properties. The glass fiber employable in the invention generally has a mean length of 0.1 to 20 mm, preferably 0.3 to 6 mm, and generally has an aspect ratio of 10 to 2,000, preferably 30 to 600. It is preferred to use a glass fiber having a mean length in the above range and an aspect ratio in the above range. By the use of such glass fiber, the resulting resin composition can be improved in the molding properties, and hence there can be obtained molded products particularly excellent in heat resistance (e.g., heat distortion temperature) and mechanical properties (e.g., tensile strength and flexural strength). The glass fiber is generally used in an amount of not more than 200 parts by weight, preferably 5 to 180 parts by weight, more preferably 5 to 150 parts by weight, per 100 parts by weight of the resin component(s) contained in the compositions of the invention.

In the fourth and fifth thermoplastic resin composition of the invention, fillers of various forms such as powdery, particulate, lamellar, needle-like, cross-like and mat-like forms can be employed as well as the above-mentioned fibrous fillers. As fillers of various forms, there can be employed powdery or lamellar inorganic compounds, for example, silica, silica alumina, alumina, titanium dioxide, talc, diatomaceous earth, clay, kaolin, glass, mica, gypsum, red oxide and zinc oxide. Also employable are powdery, lamellar, fibrous or cross-like secondary products formed from all aromatic polyamide such as polyparaphenylene terephthalamide, polymetaphenylene terephthalamide, polyparaphenylene isophthalamide, polymetaphenylene isophthalamide, a condensate of diaminodiphenylether with terephthalic acid or isophthalic acid and a condensate of para(meta)aminobenzoic acid; all aromatic polyamideimides such as a condensate of diaminodiphenylether with trimellitic anhydride or pyromellitic anhydride; all aromatic polyesters; heterocyclic compounds such as all aromatic polyimides, polybenzimidazole, polyimidazophenanthrene; and polytetrafluoroethylene.

These fillers can be employed singly or in combination. Further, these fillers can be beforehand treated with silane coupling agents or titanium coupling agents. A mean particle diameter of such powdery filler is generally in the range of 0.1 to 200 $\mu$m, preferably 1 to 100 $\mu$m.

The powdery filler is generally used in an amount of not more than 200 parts by weight, preferably not more than 100 parts by weight, more preferably 0.5 to 50 parts by weight, per 100 parts by weight of the resin component(s) (i.e., total amount of polyamide [I] and optionally used modified polyolefin [II]) contained in the compositions.

To the fourth and fifth thermoplastic resin compositions of the invention may be added heat-resistant thermoplastic resins, provided that the addition of the thermoplastic resins does not mar the properties of the resin compositions of the invention. Examples of the heat-resistant thermoplastic resins include PPS (polyphenylene sulfide), PPE (polyphenyl ether), PES (polyether sulfone), PEI (polyether imide) and LCP (liquid crystal polymer). Modified compounds of those resins can be also employed. Of these, particularly preferred is polyphenylene sulfide. The content of the heat-resistant thermoplastic resin in the compositions of the invention generally is less than 50% by weight, preferably in the range of 0 to 40% by weight.

The polyamide resin compositions of the invention can be prepared, for example, by mixing the polyamide [I], the aromatic amine-type stabilizer [III] and the organic phosphite-type stabilizer [IV], and if necessary, the modified polyolefin [II], then adding optional additives such as a filler to the resulting mixture with keeping the mixture of the components [I], [III] and [IV] or the components [I], [II], [III] and [IV] in the molten state, and kneading the mixture.

In the preparation of the fourth and fifth resin compositions of the invention, an order of addition of those components can be optionally determined. For example, in the fifth polyamide resin composition of the invention, the polyamide [I] and the modified polyolefin [II] can be initially mixed (or kneaded) with each other to prepare a resin composition, then to the composition can be added the aromatic amine-type stabilizer [III] and the organic phosphite-type stabilizer [IV], and finally various additives can be optionally added to the resulting composition. Otherwise, all of those components (i.e., components [I] to [IV] and optional additives) may be mixed (or kneaded) with each other at the same time to prepare a resin composition. For the pre-mixing (or pre-kneading), various known mixing devices such as a mortar, Henschel mixer, a ball mill and a ribbon blender can be employed. For the melt-mixing of all components, melt-mixing devices such as Banbury mixer can be employed.

In general, the modified polyolefin is finely dispersed in the aromatic polyamide through the kneading, to form so-called "polymer alloy".

The fourth and fifth resin composition prepared as above is subjected to conventional melt-molding methods such as compression molding, injection molding and extrusion molding, to produce a molded product of desired form.

A molded product can be produced, for example, by introducing the fourth and fifth resin composition of the invention into an injection molding apparatus having a cylinder temperature of approx. 280° to 350° C. to melt the composition, and then introducing the molten composition into a mold of given shape.

There is no specific limitation on the shape of molded products formed from the fourth and fifth resin compositions of the invention, and the compositions of the invention can be molded into various shaped products such as mechanical parts (e.g., gear and cam) and electronic parts (e.g., printable wiring board, housing for electronic components and connector).

EFFECT OF THE INVENTION

The first thermoplastic resin composition of the invention can be much more restrained in occurrence of strand-foaming in the granulation stage as compared with conventional flame-retardant resin compositions, and further the resin composition shows excellent color shade of pellets. Moreover, the resin composition is not reduced in its properties such as heat resistance and flame retardance.

The second thermoplastic resin composition of the invention is not reduced in the properties inherently belonging to polyamide resin, for example, heat resistance and flame retardance, and further the resin composition can hold degree of the mold-staining brought about in the molding stage to less than ½ of that given by the conventional polyamide resin compositions.

The third thermoplastic resin composition of the invention contains a polyamide resin and a brominated compound of a copolymer formed from an aromatic vinyl monomer and an $\alpha,\beta$-unsaturated dicarboxylic acid, so that the resin composition shows high flame retardance. Moreover, the resin composition is excellent in heat resistance and heat stability. Accordingly, when electronic components are soldered onto a board formed from the resin composition of the invention under heating by irradiation with infrared rays, there can be obtained electronic parts which are more suitable for the infrared rays reflow-soldering as compared with the conventional electronic parts.

The fourth and fifth thermoplastic resin compositions of the invention comprises the aforementioned components, so that they are remarkably enhanced in heat aging characteristics and molding stability, and further they are excellent in mechanical, chemical and physical properties.

The present invention is further described by the following examples, but the examples are by no means given to restrict the invention.

EXAMPLE 1

Specimens (1/32 inches) were prepared by using the following polyamide A.

Polyamide A

A polyamide resin comprising a dicarboxylic component (composed of 60 mol % of terephthalic acid and 40 mol % of adipic acid) and a diamine component (hexamethylenediamine) and having a melting point (Tm) of 326° C. and an intrinsic viscosity $[\eta]$ of 1.13 dl/g as measured at 30° C. in concentrated sulfuric acid.

There was kneaded 100 parts by weight of the polyamide A together with 41 parts by weight (corresponding to 28 parts by weight in terms of bromine atom) of brominated polystryrene (trade name: Pyrocheck 68 PB, a product of Nissan Ferro Organic Chemical KK, bromine content: 68.5%) as an halogenated organic compound, 12 parts by weight (corresponding to 10 parts by weight in terms of antimony atom) of antimony trioxide (tarade name: Patox C, a product of Nippon Seiko KK) as an antimony compound, 1.0 part by weight of barium hydrogenphosphate as a phosphorus-containing compound and 66 parts by weight of glass fiber (trade name: 03 MA 486A, a product of Asahi Fiber Glass KK) in a twin-screw extruder (trade name: PCM-45, a product of Ikegai Iron Works, Ltd.) set at a cylinder temperature of 330° C. to prepare pellets. The whole amount of the above-mentioned ingredients excluding glass fiber was fed through the main feed opening and only glass fiber was fed through the side feed opening.

The resulting pellets were injection-molded to prepare the specimens (1/32 inches) for UL combustion test.

Granulability, color tone of pellet and flame retardance were evaluated according to he following methods by using the resulting specimens.

(1) Granulability

The expansion state of strand was judged by visual inspection when granulation was carried out at a rate of 12 kg/hr in a twin-screw extruder.

(2) Color Tone of Pellet

The color of pellets was judged by visual inspection after the above-mentioned strand was pelletized by means of a cutter.

(3) Flame Retardance

Flame retardance was measured according to UL standard (UL-94).

The test results are shown in Table 1.

COMPARATIVE EXAMPLE 1

The procedure of Example 1 was repeated except that the phosphorus compound was omitted.

The results are shown in Table 1.

EXAMPLES 2 TO 10 COMPARATIVE EXAMPLES 2 TO 6

The procedure of Example 1 was repeated except that compounds indicated in Table 1 were used in an amount indicated in Table 1.

The results are shown in Table 1.

In Table 1, Polyamides A to D and PET as the thermoplastic resins, brominated polystyrene and brominated crosslinked aromatic polymer as the halogenated organic compounds, antimony trioxide and sodium antimonate as the antimony compounds and the phosphorus-containing compounds A to D were following compounds or products. Twin-screw extruder (trade name: PCM-45, manufactured by Ikegai Iron Works, Ltd.) was used.

Thermoplastic Resin

Polyamide A: The same as that used in Example 1

Polyamide B: Nylon 66 (trade name: CM 3001 N, a product of Toray Industries, Inc.)

Polyamide C: Nylon 46 (trade name: STANYL, a product of DSM, Holland)

Polyamide D: A polyamide resin comprising a dicarboxylic acid component (composed of 70 mol % of terephthalic acid and 30 mol % of isophthalic acid) and a diamine component (hexamethylenediamine) and having a melting point of 324° C. and intrinsic viscosity $[\eta]$ of 0.99 dl/g as measured at 30° C. in concentrated sulfuric acid.

PET: Polyethylene terephthalate (IV=0.65)

Halogenated Organic Compound

Brominated polystyrene: Pyrocheck 68 PB (Br content: 68.5%, a product of Nissan Ferro Organic Chemical KK)

Brominated Crosslinked aromatic polymer: EBR-370 FK (Br content: 65.6%, a product of Manack KK)

Antimony Compound

Antimony trioxide: Patox C (a product of Nippon Seiko KK)

Sodium Antimonate: Sunepock NA-1075 (a product of Nissan Chemical Industries, Ltd.)

Phosphorus-Containing Compound

A: Disodium hydrogenphosphate
B: Barium hydrogenphosphate
C: Sodium di(2-ethylhexyl) phosphate
D: UV-check AM-595 (trade name, a composition composed of disodium hydrogenphosphate (74%) as main ingredient and barium alkyl phosphate, a product of Nissan Ferro Organo Chemical KK)

Other Additive

Glass fiber (GF): 03 MA 486 A (trade name, a product of Asahi Fiber Glass KK)

TABLE 1

|  | Ex. 1 | Ex. 2 | Comp. Ex. 1 | Ex. 3 |
| --- | --- | --- | --- | --- |
| Blending composition (part by weight) | | | | |
| Thermoplastic resin (part by weight) | Polyamide A (100) | Polyamide A (100) | Polyamide A (100) | Polyamide A (100) |
| Halogenated organic compound | Pyrocheck 68 PB | Pyrocheck 68 PB | Pyrocheck 68 PB | Pyrocheck 68 BP |
| (part by weight) | (41) | (41) | (41) | (41) |
| [part by weight in terms | [28] | [28] | [28] | [28] |

TABLE 1-continued

| of halogen atom] | | | | |
|---|---|---|---|---|
| Antimony compound | antimony trioxide | antimony trioxide | antimony trioxide | sodium antimonate |
| (part by weight) | (12) | (12) | (12) | (14) |
| [part by weight in terms of antimony atom] | [10] | [10] | [10] | [8.8] |
| Phosphorus-containing compound | B 1.0 | C 1.5 | 0 | A 1.0 |
| Glass fiber | 66 | 66 | 66 | 67 |
| Cylinder temperature (°C.) | 330 | 330 | 330 | 330 |
| Granulability | no problem | no problem | *2 | no problem |
| Color tone of pellet | brownish yellow | brownish yellow | dark brown | brownish yellow |
| Flame retardance (UL-94) | V-O | V-O | V-O | V-O |

| | Ex. 4 | Comp. Ex. 2 | Ex. 5 | Ex. 6 |
|---|---|---|---|---|
| Blending composition (part by weight) | | | | |
| Thermoplastic resin | Polyamide A | Polyamide A | PET | PET |
| (part by weight) | (100) | (100) | (100) | (100) |
| Halogenated organic compound | Pyrocheck 68 PB | Pyrocheck 68 PB | EBR-370FK | EBR-370FK |
| (part by weight) | (41) | (41) | (30) | (30) |
| [part by weight in terms of halogen atom] | [28] | [28] | [20] | [20] |
| Antimony compound | sodium antimonate | sodium antimonate | sodium antimonate | sodium antimonate |
| (part by weight) | (14) | (14) | (8) | (8) |
| [part by weight in terms of antimony atom] | [8.8] | [8.8] | [5] | [5] |
| Phosphorus-containing compound | B 1.5 | 0 | A 1.0 | D 1.5 |
| Glass fiber | 67 | 67 | 60 | 60 |
| Cylinder temperature (°C.) | 330 | 330 | 280 | 280 |
| Granulability | no problem | *2 | no problem | no problem |
| Color tone of pellet | brownish yellow | brown | light grey | light grey |
| Flame retardance (UL-94) | V-O | V-O | V-O | V-O |

| | Comp. Ex. 3 | Ex. 7 | Comp. Ex. 4 | Ex. 8 |
|---|---|---|---|---|
| Blending composition (part by weight) | | | | |
| Thermoplastic resin | PET | Polyamide B | Polyamide B | Polyamide C |
| (part by weight) | | | | |
| Halogenated organic compound | EBR-370FK | Pyrocheck 68 PB | Pyrocheck 68 PB | Pyrocheck 68 PB |
| (part by weight) | (30) | (42) | (42) | (38) |
| [part by weight in terms of halogen atom] | [20] | [29] | [29] | [26] |
| Antimony compound | sodium antimonate | antimony trioxide | antimony trioxide | antimony trioxide |
| (part by weight) | (8) | (12) | (12) | (12) |
| [part by weight in terms of antimony atom] | [5] | [10] | [10] | [10] |
| Phosphorus-containing compound | 0 | D 1.5 | 0 | A 1.0 |
| Glass fiber | 60 | 60 | 60 | 65 |
| Cylinder temperature (°C.) | 280 | 270 | 270 | 290 |
| Granulability | *1 | no problem | no problem | no problem |
| Color tone of pellet | brownish grey | brownish yellow | dark grey | brownish yellow |
| Flame retardance (UL-94) | V-O | V-O | V-O | V-O |

| | Ex. 9 | Comp. Ex. 5 | Ex. 10 | Comp. Ex. 6 |
|---|---|---|---|---|
| Blending composition (part by weight) | | | | |
| Thermoplastic resin | Polyamide C | Polyamide C | Polyamide D | Polyamide D |
| (part by weight) | (100) | (100) | (100) | (100) |
| Halogenated organic compound | Pyrocheck 68 PB | Pyrocheck 68 PB | Pyrocheck 68 PB | Pyrocheck 68 PB |
| (part by weight) | (38) | (38) | (38) | (38) |
| [part by weight in terms of halogen atom] | [26] | [26] | [26] | [26] |
| Antimony compound | antimony trioxide | antimony trioxide | sodium antimonate | sodium antimonate |
| (part by weight) | (12) | (12) | (8) | (8) |
| [part by weight in terms of antimony atom] | [10] | [10] | [5] | [5] |
| Phosphorus-containing compound | D 1.5 | 0 | D 1.5 | 0 |
| Glass fiber | 65 | 65 | 63 | 63 |
| Cylinder temperature (°C.) | 290 | 290 | 330 | 330 |
| Granulability | no problem | *2 | no problem | *2 |
| Color tone of pellet | brownish yellow | dark brown | brownish yellow | brown |
| Flame retardance (UL-94) | V-O | V-O | V-O | V-O |

*1: Strand was slightly expanded
*2: Strand was remarkably expanded

EXAMPLE 11

There was kneaded 100 parts by weight of a polyamide (PAGTG;terephthalic acid/adipic acid=55/45 by molar ratio, Tm=312° C., intrinsic viscosity of 1.20 dl/g as measured at 30° C. in concentrated sulfuric acid) together with 38 parts by weight (corresponding to 28.5 parts by weight in terms of bromine atom) of Pyrocheck 68 PB as the halogenated organic compound, 16 parts by weight (corresponding to 10.1 parts by weight in terms of antimony atom) of sodium antimonate $Na_2Sb_2O_6$ as the antimony compound, 1.5 parts by weight of UV-check AM595 as the phosphorus-containing compound, 0.75 parts by weight of an amine-type stabilizer (A-1: 4,4-bis(α,α-dimethylbenzyl)diphenylamine) and 67.0 parts by weight of glass fiber in a twin-screw extruder set at a cylinder temperature of 320° C. to prepare pellets. The whole amount of the above-described ingredients excluding glass fiber was fed through the main feed opening, and only glass fiber was fed through the side feed opening.

The resulting pellets were injection-molded, and the staining of mold was evaluated in the following manner.

Evaluation Method of Mold Staining

Continuous molding of 2000 shots at a rate of 25 sec/cycle was carried out by using an injection mold for molding a disc of 70 mm in diameter and 2 mm in thickness, said mold having a specular finished disc-form liner of 70 mm in diameter, named of SKD II on the movable platen side, in which gate entered the center of the disc at a right angle. After the completion of the molding, the disc-form liner was taken out and visually examined whether deposit on the surface thereof was observed or not, and the degree of fog was visually examined. The mold temperature during molding was 70° C., and the cylinder temperature varied depending on the types of the polyamides and was indicated in Table 2.

The results are shown in Table 2.

COMPARATIVE EXAMPLE 7

The procedure of Example 11 was repeated except that the amine-type stabilizer was omitted.

The results are shown in Table 2.

EXAMPLES 12 TO 22 AND COMPARATIVE EXAMPLES 8 AND 9

The procedure of Example 11 was repeated except that compounds indicated in Table 2 were used in an amount indicated in Table 2 and the molding of pellets was carried out at a cylinder temperature indicated in Table 2.

The results are shown in Table 2.

The polyamides, the organohalogen compound, the antimony comounds, the phosphorus-containing compounds, the amine-type stabilizer, the phosphorus-type stabilizer and glass fiber (GF) which were used were the following compounds or products.

Polyamide

PA 66: CM 3001 N (trade name, a product of Toray Industries, Inc.)

PA 46: F5000 (trade name, intrinsic viscosity: 1.67 dl/g as measured at 30° C. in sulfuric acid, a product of Unitika, Ltd.)

PA 6T6: A polyamide resin (terephthalic acid/adipic acid=55/45 by molar ratio, Tm=312° C., intrinsic viscosity: 1.20 dl/g as measured at 30° C. in sulfuric acid)

Halogenated Organic Compound

Polydibromophenylene oxide (trade name: PO-64P, a product of Great Lakes)

Brominated polystyrene (trade name: Pyrocheck 68 PB, a product of Nissan Ferro Organic Chemical KK)

Antimony Compound

Antimony trioxide (trade name: Patox C, a product of Nippon Seiko KK)

Sodium antimonate $Na_2Sb_2O_6$ (trade name: Sunepock NA-1075, a product of Nissan Chemical Industries, Ltd.)

Phosphorus-Containing Compound

UV-check AM595 (trade name: a product of Nissan Ferro Chemical KK)

Amine-Type Stabilizer (A-1): 4,4-bis(α,α-dimethylbenzyl)diphenylamine (A-2): N,N'-di-β-naphthyl-P-phenylenediamine

Phosphorus-Type Stabilizer (P-1): Tetrakis (2,4-di-t-butylphenyl)-4,4,-biphenylene diphosphonite (P-2): Tris(2,4-di-t-butylphenyl) phosphite

Glass Fiber ()

Chopped strand (diameter: 13 μm. length: 3 mm)

TABLE 2

|  | Ex. 11 | Ex. 12 | Ex. 13 | Ex. 14 | Comp. Ex. 7 |
| --- | --- | --- | --- | --- | --- |
| part by weight |  |  |  |  |  |
| Polyamide | (PA6T6) 100 | (PA6T6) 100 | (PA6T6) 100 | (PA6T6) 100 | (PA6T6) 100 |
| Halogenated organic compound | (68 PB) 38 | (68 PB) 38 | (68 PB) 38 | (68 PB) 38 | (68 PB) 38 |
| (part by weight in terms of halogen atom) | (Br 25.8) | (Br 25.8) | (Br 25.8) | (Br 25.8) | (Br 25.8) |
| Antimony compound | ($Na_2Sb_2O_6$) 16 | ($Na_2Sb_2O_6$) 16 | ($Na_2Sb_2O_6$) 16 | ($Na_2Sb_2O_6$) 16 | ($Na_2Sb_2O_6$) 16 |
| (part by weight in terms of antominy atom) | (Sb 10.1) | (Sb 10.1) | (Sb 10.1) | (Sb 10.1) | Sb 10.1) |
| Phosphorus-containing compound | (AM595) 1.5 | (AM595) 1.5 | (AM595) 1.5 | (AM595) 1.5 | (AM595) 1.5 |
| Amine-type Stabilizer | (A-1) 0.75 | omitted | (A-1) 0.75 | (A-1) 1.5 | omitted |
| Phosphorus-type stabilizer | omitted | (P-1) 0.75 | (P-1) 0.75 | (P-1) 1.5 | omitted |
| Glass fiber | 67.0 | 67.0 | 67.3 | 67.9 | 66.6 |
| Cylinder temperature (°C.) during molding | 320 | 320 | 320 | 320 | 320 |
| Evaluation result of mold | *A | *A | *B | *B | *C |

TABLE 2-continued staining

|  | Ex. 15 | Comp. Ex. 8 | Ex. 16 | Comp. Ex. 9 | Ex. 17 |
| --- | --- | --- | --- | --- | --- |
| part by weight |  |  |  |  |  |
| Polyamide | (PA66) 100 | (PA66) 100 | (PA46) 100 | (PA46) 100 | (PA6T6) 100 |
| Halogenated organic compound | (PO-64P) 31 | (PO-64P) 31 | (68 PB) 40 | (68 PB) 40 | (68 PB) 38 |
| (part by weight in terms of halogen atom) | (Br 19.8) | (Br 19.8) | (Br 27.2) | (Br 27.2) | (Br 25.8) |
| Antimony compound | ($Sb_2O_3$) 19 | ($Sb_2O_3$) 19 | ($Sb_2O_3$) 17 | ($Sb_2O_3$) 17 | ($Na_2Sb_2O_6$) 16 |
| (part by weight in terms of antominy atom) | (Sb 15.9) | (Sb 15.9) | (Sb 14.2) | (Sb 14.2) | (Sb 10.1) |
| Phosphorus-containing compound | (AM595) | (AM595) | (AM595) | (AM595) | (AM595) |
| Amine-type Stabilizer | (A-1) 0.75 | omitted | (A-1) 0.75 | omitted | (A-2) 0.75 |
| Phosphorus-type stabilizer | (P-1) 0.75 | omitted | (P-1) 0.75 | omitted | omitted |
| Glass fiber | 65.9 | 64.9 | 68.6 | 67.9 | 67.0 |
| Cylinder temperature (°C.) during molding | 280 | 280 | 310 | 310 | 320 |
| Evaluation result of mold staining | *D | *E | *F | *C | *G |

|  | Ex. 18 | Ex. 19 | Ex. 20 | Ex. 21 | Ex. 22 |
| --- | --- | --- | --- | --- | --- |
| part by weight |  |  |  |  |  |
| Polyamide | (PA6T6) 100 | (PA6T6) 100 | (PA6T6) 100 | (PA6T6) 100 | (PA6T6) 100 |
| Halogenated organic compound | (68 PB) 38 | (68 PB) 38 | (PO-64P) 31 | (PO-64P) 31 | (68 PB) 40 |
| (part by weight in terms of halogen atom) | (Br 25.8) | (Br 25.8) | (Br 19.8) | (Br 19.8) | (Br 27.2) |
| Antimony compound | ($Na_2Sb_2O_6$) 16 | ($Na_2Sb_2O_6$) 16 | ($Sb_2O_3$) 19 | ($Sb_2O_3$) 19 | ($Sb_2O_3$) 17 |
| (part by weight in terms of antominy atom) | (Sb 10.1) | (Sb 10.1) | (Sb 15.9) | (Sb 15.9) | (Sb 14.2) |
| Phosphorus-containing compound | (AM595) 1.5 | (AM595) 1.5 | (AM595) 1.5 | (AM595) 1.5 | (AM595) 1.5 |
| Amine-type Stabilizer | omitted | (A-2) 0.75 | (A-2) 0.75 | omitted | omitted |
| Phosphorus-type stabilizer | (P-2) 0.75 | (P-2) 0.75 | (P-2) 0.75 | (P-2) 0.75 | (P-2) 0.75 |
| Glass fiber | 67.0 | 67.3 | 65.9 | 64.9 | 68.6 |
| Cylinder temperature (°C.) during molding | 320 | 320 | 280 | 280 | 310 |
| Evaluation result of mold staining | *A | *B | *D | B* | *A |

*A: Deposit was slightly found on the outer periphery part (about ¼ of the whole surface). Fog was slightly found on area where no deposit was found.
*B: Deposit was slightly found on the outer periphery part (about 1/10 or less of the whole surface). Fog was scarcely found on area where no deposit was found.
*C: Pale yellow deposit was found on the outer periphery part (about ½ of the whole surface). Fog was considerably found on area where no deposit was found.
*D: No deposit. Slight fog.
*E: Pale yellow deposit was found on the outer periphery part (about ¼ of the whole surface). Fog was considerably found on area where no deposit was found.
*F: Deposit was slightly found on the outer periphery part (about 1/10 or less of the whole surface). Fog was slightly found on area where no deposit was found.
*G: Deposit was found on the outer periphery part (about ½ of the whole surface). Fog was found on area where no deposit was found.

EXAMPLE 23

Preparation of Specimen

Into a conventional twin-screw extruder (trade name: PCM-45, manufactured by Ikegai Iron Works, Ltd.) was introduced through the hopper thereof 65 parts by weight of a polyamide resin (nylon 6TI) containing 35 mol % of terephthalic acid component unit, 15 mol % of isophthalic acid component unit and 50 mol % of hexamethylenediamine unit. Further, 25 parts by weight of a brominated product (bromine content: 69%, trade name: Pyrocheck SMA, a product of Nissan Ferro Organic Chemical KK, hereinafter abbreviated to SMA-Br), which is a brominated compound of a styrene-maleic anhydride copolymer (maleic anhydride content: 6%, average molecular weight: about 200,000), 5 parts by weight of sodium antimonate and 5 parts by weight of magnesium oxide were introduced thereinto through the side feeder. The cylinder temperature during extrusion was set to 330° C., and the mixture was extruded to prepare pellets.

The above-described polyamide had an intrinsic viscosity [η] of 0.94 dl/g as measured at 30° C. in concentrated sulfuric acid and a melting point (Tm) of 321° C.

The resulting pellets were injection-molded at a cylinder temperature of 330° C. and at a mold temperature of 120° C. by using an injection molding machine (Promat 40/25A type, manufactured by Sumitomo Heavy Industries Co., Ltd.) to prepare specimens of 1/32 inches in thickness. The mold used was a mold for combustion piece according to UL 94.

Test Method

The combustibility and heat resistance of the specimens prepared in the manner described above were evaluated by the following test methods.

Combustibility

Combustion test was carried out according to UL 94 standard. The results are shown in Table 3.

Heat Resistance

Example 27 and Comparative Example 14 ... 260° C.

TABLE 3

|  | Ex. 23 | Ex. 24 | Ex. 25 | Ex. 26 | Ex. 27 | Comp. Ex. 10 | Comp. Ex. 11 | Comp. Ex. 12 | Comp. Ex. 13 | Comp. Ex. 14 |
|---|---|---|---|---|---|---|---|---|---|---|
| Composition (part by weight) | | | | | | | | | | |
| Polyamide resin | | | | | | | | | | |
| Nylon 6TI*[1] | 65 | — | — | — | — | 65 | — | — | — | — |
| Nylon 6TI-2*[2] | — | 68 | — | — | — | — | 68 | — | — | — |
| Nylon 6Y6*[3] | — | — | 68 | — | — | — | — | 68 | — | — |
| Nylon 46*[4] | — | — | — | 68 | — | — | — | — | 68 | — |
| Nylon 66*[5] | — | — | — | — | 68 | — | — | — | — | 68 |
| SMA-Br*[6] | 25 | 25 | 26 | 26 | 26 | — | — | — | — | — |
| 68 PB*[7] | — | — | — | — | — | 25 | 26 | 26 | 26 | 26 |
| Sodium antimonate | 5 | 6 | 6 | — | — | 5 | — | 6 | — | — |
| Antimony trioxide | — | — | — | 6 | 6 | — | 6 | — | 6 | 6 |
| Magnesium oxide | 5 | — | — | — | — | 5 | — | 5 | — | — |
| Water absorption ratio | 3.9 | 3.8 | 3.6 | 6.6 | 5.1 | 3.7 | 3.8 | 3.6 | 6.6 | 5.0 |
| Combustibility | V-O | V-O | V-O | V-O | V-O | V-O | V-O | V-O | V-O | V-O |
| Reflow-resistant temperature (°C.) | 220 | 240 | 240 | 230 | 210 | 210 | 220 | 220 | 210 | 200 |

*[1]Terephthalic acid component unit: 35 mol %, isophthalic acid component unit: 15 mol %, hexamethylene diamine unit: 50 mol %, [η] = 0.94, Tm = 321° C.

*[2]Terephthalic acid component unit: 40 mol %, isophthalic acid component unit: 10 mol %, hexamethylene diamine unit: 50 mol %, [η] = 1.32, Tm = 343° C.

*[3]Terephthalic acid component unit: 27.5 mol %, adipic acid component unit: 22.5 mol %, hexamethylene diamine unit: 50 mol %, [η] = 1.02, Tm = 312° C.

*[4]Trade name: F5000, manufactured by Unitika. Ltd.

*[5]Tradename: CM-3000-N, manufactured by Toray Industries, Inc.

*[6]Brominated styrene-maleic anhydride copolymer (bromide content: 69%, trade name: Procheck SMA, manufactured by Nissan Ferro Organic Chemical KK)

*[7]Brominated polystyrene (bromine content: 68%, trade name: Procheck 68PB, manufactured by Nissan Ferro Organic Chemical KK)

The specimens were placed in an air-conditioned bath at 40° C. and 90% RH to thereby allow moisture to be previously absorbed by the specimens. The specimens were passed through an infrared reflow furnace (MJ-R4000 type, manufactured by Jard) wherein preheating temperature was set at 150° C. and heating temperature was set in the range of 210° to 250° C. at intervals of 10° C. The maximum temperature at which the surface state of the specimens could be kept normal was referred to as reflow-resistant temperature (when the temperature exceeds reflow-resistant temperature, absorbed water is rapidly evaporated and the surface of the specimen becomes an expanded state).

Heating temperature was 20 seconds (constant) each time. The results are shown in Table 3.

COMPARATIVE EXAMPLE 10

The procedure of Example 23 was repeated except that the brominated polystyrene (bromine content: 68%, Pyrocheck 68 PB (hereinafter abbreviated to 68PB), a product of Nissan Ferro Organic Chemical KK) was used in place of SMA-Br to prepare specimens. The combustibility and heat resistance of the resulting specimens were evaluated. The results are shown in Table 3.

EXAMPLES 24 TO 27 AND COMPARATIVE EXAMPLES 11 TO 14

The procedure of Example 23 was repeated except that ingredients indicated in Table 3 were used to prepare specimens composed of a polyamide resin composition given in Table 3. The combustibility and heat resistance of the resulting specimens were evaluated. The results are shown in Table 3.

The cylinder temperature during extrusion for the preparation of pellets was as follows.

Example 24 and Comparative Example 11 ... 340° C.
Example 25 and Comparative Example 12 ... 310° C.
Example 26 and Comparative Example 13 ... 290° C.

EXAMPLE 28

The following stabilizers were used.

Aromatic, amine-type stabilizer; trade name: Nocrack CD [4,4'-bis(α,α-dimethylbenzyl)diphenylamine, a product of Shinko KK]

Organic phosphite stabilizer; trade name: Sand Staff P-EPQ [tetrakis(2,4-di-t-butylphenyl)-4,4'-biphenylenediphosphonite, a product of Sand]

As polyamide, there was used a polyamide (PA-1) comprising an acid component composed of 70 mol % of terephthalic acid and 30 mol % of isophthalic acid and a diamine component composed of 100 mol % of 1,6-diaminohexane and having an intrinsic viscosity [η] of 1.0 dl/g as measured at 30° C. in concentrated sulfuric acid and a melting point of 325° C.

The aforesaid aromatic amine stabilizer (Nocrack CD) and the aforesaid organic phosphite stabilizer (P-EPQ) were blended with the polyamide (PA-1) in such an amount that the content of each stabilizer was 0.5% by weight based on the amount of the resulting polyamide composition. The resulting blend was kneaded at 330° C. in a twin-screw extruder (PCM-30, manufactured by Ikegai Iron Works, Ltd.) to prepare an aromatic polyamide composition.

The resulting aromatic polyamide composition was injection-molded at 330° C. to prepare specimens for the measurement of physical properties. The composition was excellent in moldability so that the desired specimens having good appearance could be readily prepared.

Specimens:
ASTM-No.4 for tensile test
125×12.5×3 mm for flexural test

The above-described specimens were aged in a gear oven at 150° C. A change in flexural strength and tensile strength with the passage of time was measured. The results are shown in Table 4.

The physical properties were measured according to the following methods.

Flexural strength: ASTM D790
Tensile strength and tensile elongation: ASTM D638

COMPARATIVE EXAMPLE 15

The procedure of Example 28 was repeated except that both the aromatic amine stabilizer (Nocrack CD) and the organic phosphite stabilizer (P-EPQ) were omitted. The injection molded specimens were found to have flash marks probably caused by the pyrolysis gas of the resin. The results are shown in Table 4.

COMPARATIVE EXAMPLE 16

The procedure of Example 28 was repeated except that only the organic phosphite stabilizer (P-EPQ) was used as the stabilizer and the aromatic amine stabilizer (Nocrack CD) was omitted. The injection-molded specimens had good appearance. The results are shown in Table 4.

COMPARATIVE EXAMPLE 17

The procedure of Example 28 was repeated except that only the aromatic amine stabilizer (Nocrack) was used as the stabilizer and the organic phosphite stabilizer (P-EPQ) was omitted. The injection-molded specimens had good appearance. The results are shown in Table 4.

EXAMPLE 29

The experiment of Example 28 was repeated except that a polyamide (PA-2) comprising an acid component composed of 55 mol % of terephthalic acid and 45 mol % of adipic acid and a diamine component composed of 100 mol % of 1,6-diaminohexane and having an intrinsic viscosity [$\eta$] of 1.0 dl/g as measured at 30° C. in concentrated sulfuric acid and a melting point of 312° C., was used as the polyamide, and extrusion temperature and injection molding temperature were 320° C.

The resulting aromatic polyamide composition was excellent in moldability so that the desired specimens having good appearance could be readily prepared. The results are shown in Table 4.

COMPARATIVE EXAMPLE 18

The procedure of Example 28 was repeated except that both the aromatic amine stabilizer (Nocrack CD) and the organic phosphite stabilizer (P-EPQ) were omitted from the composition of Example 29. The injection-molded specimens were found to have flash marks probably caused by the pyrolysis gas of the resin. The results are shown in Table 4.

COMPARATIVE EXAMPLE 19

The procedure of Example 28 was repeated except that the organic phosphite stabilizer (P-EPQ) was used and the aromatic amine stabilizer (Nocrack CD) was omitted from the composition of Example 29. The injection-molded specimens had good appearance. The results are shown in Table 4.

COMPARATIVE EXAMPLE 20

The procedure of Example 28 was repeated except that the aromatic amine stabilizer (Nocrack CD) was used and the organic phosphite stabilizer (P-EPQ) was omitted from the composition of Example 29. The injection-molded specimens had good appearance. The results are shown in Table 4.

EXAMPLE 30

There was used a blend consisting of 80 parts by weight of PA-1 as the polyamide and 20 parts by weight of high-density polyethylene (the amount of grafted maleic acid: 1% by weight, density: 0.95 g/cc, intrinsic viscosity: 3.74 dl/g as measured at 135° C. in decalin) as a modified polyolefin.

The aforesaid aromatic amine stabilizer (Nocrack CD) and the aforesaid organic phosphite stabilizer (P-EPQ) were blended with the above blend in such an amount that the amount of each stabilizer was 0.5% by weight based on the amount of the resulting polyamide composition. The resulting blend was kneaded at 320° C. in the twin-screw extruder ( trade name: PCM-30, manufactured by Ikegai Iron Works, Ltd.) to obtain an aromatic polyamide composition.

The resulting polyamide composition was injection-molded at 320° C. to prepare specimens for the measurement of physical properties. The composition was excellent in moldability so that the desired specimens having good appearance could be readily prepared.

The specimens were aged in a gear oven at 150° C. A change in tensile strength and tensile elongation with the passage with time was measured. The results are in Table 5.

COMPARATIVE EXAMPLE 21

The procedure of Example 30 was repeated except that both the aromatic amine stabilizer (Nocrack CD) and the organic phosphite stabilizer (P-EPQ) were omitted. The resulting injection-molded specimens were found to have flash marks and burn marks probably caused by the pyrolysis gas of the resin. The results are shown in Table 5.

COMPARATIVE EXAMPLE 22

The procedure of Example 30 was repeated except that only the organic phosphite stabilizer (P-EPQ) was used as the stabilizer and the aromatic amine stabilizer (Nocrack CD) was omitted. The injection-molded specimens had good appearance. The results are shown in Table 5.

COMPARATIVE EXAMPLE 23

The procedure of Example 30 was repeated except that only the aromatic amine stabilizer (Nocrack CD) was used as the stabilizer and the organic phosphite stabilizer (P-EPQ) was omitted. The injection-molded specimens had good appearance. The results are shown in Table 5.

EXAMPLE 31

The experiment of Example 30 was repeated except that there was used a blend consisting of 80 parts by weight of PA-2 as the polyamide and 20 parts by weight of high-density polyethylene (the amount of grafted maleic acid: 1% by weight, density: 0.92 g/cc, intrinsic viscosity: 1.7 dl/g as measured at 135° C. in decalin) as a moldified polyolefin.

The resulting aromatic polyamide composition was excellent in moldability so that the desired specimens having good appearance could be readily prepared. The results are shown in Table 5.

COMPARATIVE EXAMPLE 24

The procedure of Example 30 was repeated except that both the aromatic amine stabilizer (Nocrack CD)

and the organic phosphite stabilizer (P-EPQ) were omitted. The injection-molded specimens were found to have flash marks probably caused by the pyrolysis gas of the resin. The results are shown in Table 5.

COMPARATIVE EXAMPLE 25

The procedure of Example 31 was repeated except that only the organic phosphite stabilizer (P-EPQ) was used and the aromatic amine stabilizer (Nocrack CD) was omitted. The injection-molded specimens had good appearance. The results are shown in Table 5.

COMPARATIVE EXAMPLE 26

The procedure of Example 31 was repeated except that only the aromatic amine stabilizer (Nocrack CD) was used as the stabilizer and the organic phosphite stabilizer (P-EPQ) was omitted. The injection-molded specimens had good appearance. The results are shown in Table 5.

compound is at least one compound selected from the group consisting of a brominated cross-linking aromatic polymer, brominated polystyrene, a brominated polyphenylene ether, a brominated bisphenol-type epoxy polymer, a brominated styrene-maleic anhydride copolymer, a brominated epoxy resin, a brominated phenoxy resin, a decabromodiphenyl ether, decabromobiphenyl, brominated polycarbonate and perchlorocyclopentadecane.

4. The thermoplastic resin composition as claimed in claim 1 or claim 2, wherein the antimony-containing compound is at least one compound selected from the group consisting of antimony trioxide, antimony pentaoxide, antimony tartrate and sodium antimonate.

5. The thermoplastic resin composition as claimed in claim 1 or claim 2, wherein the thermoplastic resin composition further contains a fibrous reinforcing agent.

6. The thermoplastic resin composition of claim 2,

TABLE 4

| | Polymer | Stabilizer | Flexural strength (kg/cm$^2$) | | | Tensile strength (%) | | |
|---|---|---|---|---|---|---|---|---|
| | | | initial | after 15 days | after 30 days | initial | after 15 days | after 30 days |
| Ex. 28 | PA-1 | CD/P-EPQ 0.5/0.5% | 1700 | 1700 | 1700 | 900 | 900 | 900 |
| Comp. Ex. 15 | PA-1 | — | 1650 | 800 | 600 | 900 | 600 | 350 |
| Comp. Ex. 16 | PA-1 | P-EPQ 0.5 | 1700 | 1100 | 800 | 900 | 700 | 500 |
| Comp. Ex. 17 | PA-1 | CD 0.5 | 1700 | 1300 | 1100 | 900 | 800 | 600 |
| Ex. 29 | PA-2 | CD/P-EPQ 0.5/0.5 | 1550 | 1550 | 1550 | 1000 | 1000 | 1000 |
| Comp. Ex. 18 | PA-2 | — | 1500 | 600 | 550 | 900 | 550 | 300 |
| Comp. Ex. 19 | PA-2 | P-EPQ 0.5 | 1500 | 700 | 600 | 1000 | 600 | 400 |
| Comp. Ex. 20 | PA-2 | CD 0.5 | 1500 | 1300 | 1200 | 1000 | 800 | 600 |
| Ex. 30 | PA-1/PE-1 80/20 | CD/P-EPQ 0.5/0.5% | 800 | 800 | 800 | 70 | 25 | 20 |
| Comp. Ex. 21 | PA-1/PE-1 80/20 | — | 750 | 750 | 500 | 60 | 20 | 6 |
| Comp. Ex. 22 | PA-1/PE-1 80/20 | P-EPQ 0.5 | 800 | 800 | 650 | 70 | 25 | 12 |
| Comp. Ex. 23 | PA-1/PE-1 80/20 | CD 0.5 | 800 | 800 | 700 | 70 | 25 | 15 |
| Ex. 31 | PA-2/PE-2 80/20 | CD/P-EPQ 0.5/0.5 | 700 | 700 | 700 | 60 | 25 | 20 |
| Comp. Ex. 24 | PA-2/PE-2 80/20 | — | 650 | 650 | 450 | 50 | 20 | 7 |
| Comp. Ex. 25 | PA-2/PE-2 80/20 | P-EPQ 0.5 | 700 | 700 | 650 | 60 | 20 | 8 |
| Comp. Ex. 26 | PA-2/PE-2 80/20 | CD 0.5 | 700 | 700 | 700 | 60 | 25 | 12 |

What is claimed is:

1. A thermoplastic resin composition which comprises a polyamide thermoplastic resin, a halogenated organic compound, an antimony-containing compound and a phosphorus-containing compound selected from the group consisting of a metal salt of phosphoric acid, a metal salt of alkylphosphoric ester, and a metal salt of alkylether-phosphoric ester, and mixtures thereof.

2. The thermoplastic resin composition as claimed in claim 1, wherein the halogenated organic compound is contained in an amount of 1 to 40 parts by weight in terms of halogen atom, the antimony-containing compound is contained in an amount of 1 to 30 parts by weight in terms of antimony atom, and the phosphorus-containing compound is contained in an amount of 0.1 to 10 parts by weight, per 100 parts by weight of the thermoplastic resin.

3. The thermoplastic resin composition as claimed in claim 1 or claim 2, wherein the halogenated organic wherein the halogenated organic compound is at least one compound selected from the group consisting of a brominated cross-linking aromatic polymer, brominated polystyrene, a brominated polyphenylene ether, a brominated bisphenol-type epoxy polymer, a brominated styrene-maleic anhydride copolymer, a brominated epoxy resin, a decabromodiphenyl ether, decabromobiphenyl and perchlorocyclopentadecane; and the antimony-containing compound is at least one compound selected from the group consisting of antimony trioxide, antimony pentaoxide, antimony tartrate and sodium antimonate.

7. A thermoplastic resin composition which comprises polyamide, a halogenated organic compound, an antimony-containing compound, a phosphorus-containing compound, and at least one of an amine-type stabilizer and a phosphorus-type stabilizer other than said phosphorus-containing compound, wherein said phosphorus-containing compound is at least one compound selected from the group consisting of a metal salt of phosphoric acid, a metal salt of alkylphosphoric ester, and a metal salt of alkyletherphosphoric ester, and said amine-type stabilizer is at least one of the compounds represented by the following formula (III-a and III-b);

$$R^1-NH-R^2 \quad \text{(III-a)}$$

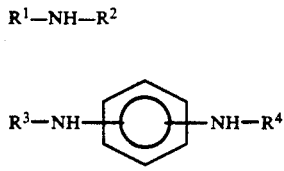 (III-b)

wherein each of $R^1$ to $R^4$ represents an alkyl group, an aromatic group, an aromatic group having one or more alkyl groups or a methacryloyloxy hydroxyalkyl group, provided that at least one of $R^1$ and $R^2$ is selected from among the aromatic group and the aromatic group having one or more alkyl groups.

8. The thermoplastic resin composition as claimed in claim 7, wherein the halogenated organic compound is contained in an amount of 1 to 40 parts by weight in terms of halogen atom, the antimony-containing compound is contained in an amount of 1 to 30 parts by weight in terms of antimony atom, the phosphorus-containing compound is contained in an amount of 0.1 to 10 parts by weight, and at least one of the amine-type stabilizer and the phosphorus-type stabilizer is contained in an amount of 0.05 to 7 parts by weight, per 100 parts by weight of the polyamide.

9. The thermoplastic resin composition as claimed in claim 7 or claim 8, wherein the halogenated organic compound is at least one compound selected from the group consisting of a brominated cross-linking aromatic polymer, brominated polystyrene, a brominated polyphenylene ether, a brominated bisphenol-type epoxy polymer, a brominated styrene-maleic anhydride copolymer, a brominated epoxy resin, a brominated phenoxy resin, a decabromodiphenyl ether, decabromobiphenyl, brominated polycarbonate and perchlorocyclopentadecane.

10. The thermoplastic resin composition as claimed in claim 7 or claim 8, wherein the antimony-containing compound is at least one compound selected from the group consisting of antimony trioxide, antimony pentaoxide, antimony tartrate and sodium antimonate.

11. The thermoplastic resin composition as claimed in claim 7 or claim 8, wherein the amine-type stabilizer is at least one compound selected from the group consisting of N,N'-diphenyl-p-phenylenediamine, a 2,2,4-trimethyl-1,2-dihydroquinoline polymer, p,p'-dioctyldiphenylamine, N-phenyl-N'-(3-methacryloyloxy-2-hydroxypropyl)-p'-phenylenediamine, 4,4'-bis(α,α-dimethylbenzyl)diphenylamine, N,N'-di-β-naphthyl-p-phenylenediamine and phenyl-α-naphthylamine.

12. The thermoplastic resin composition as claimed in claim 7 or claim 8, wherein the phosphorus-type stabilizer is at least one compound selected from the group consisting of bis(2,6-di-t-butyl-4-methylphenyl)pentaerythritol-di-phosphite, bis(2,4-di-t-butylphenyl)pentaerythritol-di-phosphite, tris(2,4-di-t-butylphenyl)phosphite, and tetrakis(2,4-di-t-butylphenyl)-4,4'-biphenylenediphosphite.

13. The thermoplastic resin composition of claim 7, wherein the polyamide is a linear polymer having an amide bond selected from the group consisting of polymers obtained by polycondensation of an organic diamine and an organic dicarboxylic acid, polymers obtained by polycondensation of an aminocaproic acid, and a polymer obtained by ring-opening of lactams.

14. The thermoplastic resin composition of claim 8, wherein the halogenated organic compound is at least one compound selected from the group consisting of a brominated cross-linking aromatic polymer, a brominated polyphenylene ether, a brominated bisphenol-type epoxy polymer, a brominated epoxy resin, brominated phenoxy resin, a decabromodiphenyl ether, decabromobiphenyl, brominated polycarbonate and perchlorocyclopentadecane; the antimony-containing compound is at least one compound selected from the group consisting of antimony trioxide, antimony pentaoxide, antimony tartrate and sodium antimonate; the amine-type stabilizer is at least one compound selected from the group consisting of N,N'-diphenyl-p-phenylenediamine, a 2,2,4-trimethyl-1,2-dihydroquinoline polymer, p,p'-dioctyldiphenylamine, N-phenyl-N'-(3-methacryloyloxy-2-hydroxypropyl)-p'-phenylenediamine, 4,4'-bis(α,α-dimethylbenzyl)diphenylamine, N,N'-di-β-naphthyl-p-phenylenediamine and phenyl-α-naphthylamine; and the phosphorus-type stabilizer is at least one compound selected from the group consisting of bis(2,6-di-t-butyl-4-methylphenyl)-pentaerythritol-di-phosphite, bis(2,4-di-t-butylphenyl)-pentaerythritol-di-phosphite, tris(2,4-di-t-butylphenyl)-phosphite, and tetrakis(2,4-di-t-butylphenyl)- 4,4'-biphenylenediphosphite.

15. The thermoplastic resin composition according to claim 14, wherein the polyamide is an aromatic polyamide composed of a dicarboxylic acid constituent unit comprising at least terephthalic acid and an alkylenediamine constituent unit comprising aliphatic alkylenediamine, alicyclic alkylenediamine, or mixtures thereof, each having from 4 to 25 carbon atoms.

16. A thermoplastic resin composition which comprises a polyamide thermoplastic resin, a brominated compound of a copolymer formed from an aromatic vinyl monomer and an α,β-unsaturated (di)carboxylic acid, or the anhydride thereof, and an antimony-containing compound,
wherein the ratio between the polyamide resin and the brominated compound contained in the composition is in the range of 90:10 to 50:50, by weight and the antimony-containing compound is contained in an amount of 1 to 30 parts by weight in terms of antimony atom, per 100 parts by weight of the polyamide.

17. The thermoplastic resin composition as claimed in claim 16, wherein the antimony-containing compound is at least one compound selected from the group consisting of antimony trioxide, antimony pentaoxide, antimony tartrate and sodium antimonate.

18. The thermoplastic resin composition as claimed in claim 16, wherein the aromatic vinyl monomer is at least one monomer selected from the group consisting of styrene, α-methylstyrene, o-methylstyrene, m-methylstyrene, p-methylstyrene, t-butylstyrene, α-methylvinyltoluene, dimethylstyrene, chlorostyrene, dichlorostyrene, bromstyrene, dibromstyrene and vinylnaphthalene.

19. The thermoplastic resin composition as claimed in claim 16, wherein the α,β-unsaturated (di)carboxylic acid is at least one compound selected from the group consisting of an acrylic acid, a methacrylic acid, a maleic acid, a fumaric acid, an itaconic acid, a citraconic acid and a 3,6-endomethylene-1,2,3,6-tetrahydrocis-phthalic acid.

20. The thermoplastic resin composition as claimed in claim 16, wherein the thermoplastic resin composition further contains a fibrous reinforcing agent.

21. The thermoplastic resin composition of claim 16, wherein the polyamide is a linear polymer having an amide bond selected from the group consisting of polymers obtained by polycondensation of an organic diamine and an organic dicarboxylic acid, polymers obtained by polycondensation of an aminocaproic acid, and a polymer obtained by ring-opening of lactams.

22. The thermoplastic resin composition of claim 21, wherein the brominated compound is a brominated compound of a styrene/maleic anhydride coplymer having a bromine content of not less than 40% by weight.

23. The thermoplastic resin composition of claim 16, wherein the ratio between the polyamide and the brominated compound is in the range of 75:25 to 65:35, by weight.

24. The thermoplastic resin composition of claim 23, which further comprises from about 1 to 20 parts by weight, per 100 parts by weight of the polyamide, of antimony trioxide, antimony pentaoxide, antimony tartrate, sodium antimonate, or mixtures thereof.

25. A thermoplastic resin composition which comprises a polyamide thermoplastic resin, a brominated compound of a copolymer formed from an aromatic vinyl monomer and an α,β-unsaturated (di)carboxylic acid; or the anhydride thereof, and an antimony-containing compound, wherein the ratio between the polyamide resin and the brominated copolymer compound contained in the composition is in the range of 90:10 to 50:50, by weight, the brominated copolymer has a bromine content of not less than 40% by weight and the antimony-containing compound is contained in an amount of 1 to 30 parts by weight in terms of antimony atom, per 100 parts by weight of the polyamide.

26. The thermoplastic resin composition as claimed in claim 25, wherein the aromatic vinyl monomer is at least one monomer selected from the group consisting of styrene, α-methylstyrene, o-methylstyrene, m-methylstyrene, p-methylstyrene, t-butylstyrene, α-methylvinyltoluene, dimethylstyrene, chlorostyrene, dichlorostyrene, bromstyrene, dibromstyrene and vinylnaphthalene.

27. The thermoplastic resin composition as claimed in claim 25, wherein the α,β-unsaturated (di)carboxylic acid is at least one compound selected from the group consisting of an acrylic acid, a methacrylic acid, a maleic acid, a fumaric acid, an itaconic acid, a citraconic acid and a 3,6-endomethylene-1,2,3,6-tetrahydro-cis-phthalic acid.

28. The thermoplastic resin composition of claim 25 wherein the brominated compound is a brominated compound of a styrene/maleic anhydride copolymer.

* * * * *